(12) United States Patent
Wang et al.

(10) Patent No.: US 12,543,364 B2
(45) Date of Patent: Feb. 3, 2026

(54) INTEGRATED CIRCUIT WITH BACKSIDE METAL GATE CUT FOR REDUCED COUPLING CAPACITANCE

(71) Applicant: Taiwan Semiconductor Manufacturing Co., Ltd., Hsinchu (TW)

(72) Inventors: Sheng-Tsung Wang, Hsinchu (TW); Huan-Chieh Su, Hsinchu (TW); Chun-Yuan Chen, Hsinchu (TW); Lin-Yu Huang, Hsinchu (TW); Ching-Wei Tsai, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 639 days.

(21) Appl. No.: 17/941,708

(22) Filed: Sep. 9, 2022

(65) Prior Publication Data
US 2023/0335444 A1    Oct. 19, 2023

Related U.S. Application Data

(60) Provisional application No. 63/331,570, filed on Apr. 15, 2022.

(51) Int. Cl.
| | | |
|---|---|---|
| *H10D 30/43* | (2025.01) | |
| *H01L 21/762* | (2006.01) | |
| *H10D 84/01* | (2025.01) | |
| *H10D 84/03* | (2025.01) | |
| *H10D 86/00* | (2025.01) | |

(52) U.S. Cl.
CPC ...... *H10D 84/038* (2025.01); *H01L 21/76232* (2013.01); *H10D 84/0151* (2025.01); *H10D 86/00* (2025.01)

(58) Field of Classification Search
None
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |

(Continued)

FOREIGN PATENT DOCUMENTS

| | | |
|---|---|---|
| TW | 202201564 A | 1/2022 |
| TW | 202213633 A | 4/2022 |

*Primary Examiner* — Steven B Gauthier
*Assistant Examiner* — Lamont B Koo
(74) *Attorney, Agent, or Firm* — Seed IP Law Group

(57) ABSTRACT

An integrated circuit includes a first nanostructure transistor and a second nanostructure transistor. The first and second nanostructure each include gate electrodes. A backside trench separates the first gate electrode from the second gate electrode. A bulk dielectric material fills the backside trench. A gate cap metal electrically connects the first gate electrode to the second gate electrode.

20 Claims, 29 Drawing Sheets

(56) References Cited

U.S. PATENT DOCUMENTS

| | | |
|---|---|---|
| 11,302,692 B2 | 4/2022 | Lin et al. |
| 2022/0093767 A1 | 3/2022 | Liaw |
| 2023/0207553 A1* | 6/2023 | Xie .................... H10D 62/121 |

* cited by examiner

INTEGRATED CIRCUIT WITH BACKSIDE METAL GATE CUT FOR REDUCED COUPLING CAPACITANCE

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanostructure transistors can assist in increasing computing power because the nanostructure transistors can be very small and can have improved functionality over convention transistors. A nanostructure transistor may include a plurality of semiconductor nanostructures (e.g. nanowires, nanosheets, etc.) that act as the channel regions for a transistor. Gate terminals may be coupled to the nanostructures. It can be difficult to form gate terminals with desired characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
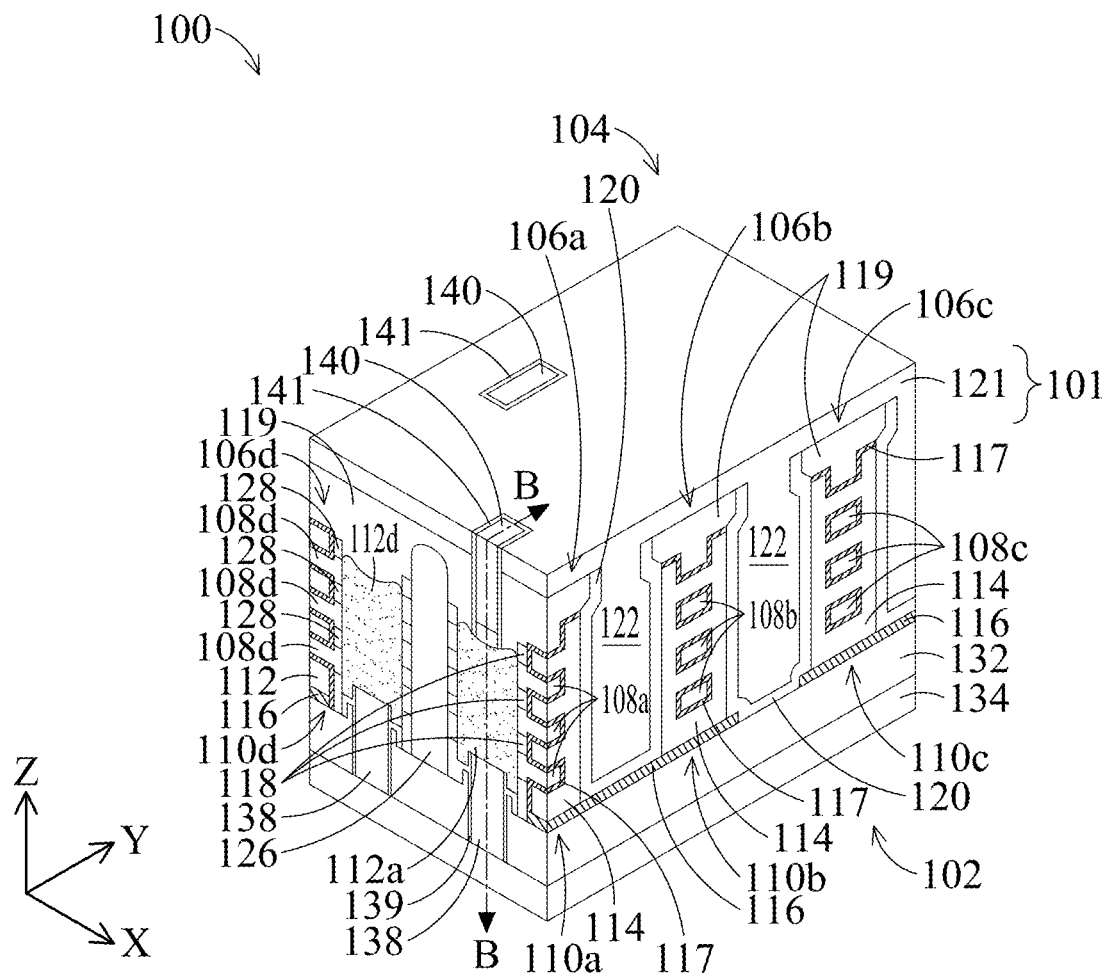
FIGS. 1A-1B are perspective views of an integrated circuit, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with nanostructure transistors having improved performance. In particular, embodiments of the present disclosure utilize a backside gate cutting process to reduce the parasitic capacitance between gate electrodes and source/drain contacts of adjacent transistors and to electrically isolate the gate electrodes of some adjacent transistors in a selective manner.

The transistors each have a plurality of semiconductor nanostructures formed over a substrate. The nanostructures act as channel regions of the nanostructure transistor. The gate electrode of each transistor includes a gate metal surrounding the nanostructures and a thin gate cap metal on top of the gate metal. When the gate metal of the gate electrodes is initially deposited, the gate metal of the gate electrodes may initially be conjoined together. The specific circuit arrangements of the transistor may call for some adjacent gate electrodes to be shorted together, and for other adjacent gate electrodes to be isolated from each other. Embodiments of the present disclosure advantageously reduce parasitic capacitances associated with the gate electrodes by removing large amounts of the gate metal between adjacent gate electrodes. Complete electrical isolation of adjacent gate electrodes can then be accomplished by selectively removing portions of the gate cap metal between adjacent transistors. The result is transistors having improved switching speed and reduced power consumption.

FIG. 1A is a perspective view of an integrated circuit 100, in accordance with some embodiments. The integrated circuit 100 includes a substrate 101. The integrated circuit also includes transistors 106 above the substrate 101. As set forth in more detail below, the integrated circuit 100 utilizes backside gate isolation structures 122 to electrically reduce parasitic capacitances associated with the transistors 106.

In some embodiments, during processing of the integrated circuit 100, the integrated circuit 100 is part of a wafer that includes a large number of identical integrated circuits that will be diced from the wafer after processing. References to the front side and the backside of the integrated circuit correspond to the front side and the backside of the wafer during processing. The front side of the integrated circuit 100 may correspond to the side on which deposition, etching, and other processes are performed during front end processing. The back side of the integrated circuit 100 may correspond to the side on which deposition, etching, and other processes are performed after front end processing is complete.

The perspective view of FIG. 1A indicates mutually orthogonal horizontal X and Y axes. The perspective view of FIG. 1A also indicates a vertical axis Z orthogonal to both the X and Y axes. The integrated circuit 100 includes a front side 102 and a back side 104. During initial processing of the integrated circuit 100, the front side 102 is upward and the backside 104 is downward. In FIG. 1A, the backside 104 is upward in front side 102 is downward to emphasize the backside processing that is performed to form backside gate isolation structures 122, as will be described in more detail below.

The integrated circuit 100 includes a plurality of transistors 106. Portions of four transistors 106a-d are apparent in FIG. 1A. During description of the integrated circuit 100, the reference number 106 may be utilized without any suffix (a, b, c, or d) when discussing the transistors of the integrated circuit 100 in general. Reference numbers 106a-d may be utilized when speaking of a particular transistor.

The transistors 106 each include a plurality of semiconductor nanostructures 108. During description of the integrated circuit 100, the reference number 108 may be utilized without any suffix (a, b, c, or d) when referring to the semiconductor nanostructures in general. The reference numbers 108a-d may be utilized when referring to the semiconductor nanostructures associated with a particular one of the transistors 106a-d.

The transistors 106 may correspond to gate all around transistors. The gate all around transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the gate all around structure. Furthermore, the gate all around transistor 106 may each include a plurality of semiconductor nanostructures corresponding to channel regions of the transistor 106. The semiconductor nanostructures may include nanosheets, nanowires, or other types of nanostructures. The gate all around transistors may also be termed nanostructure transistors.

The transistor 106a includes three semiconductor nanostructures 108a. The transistor 106b includes three semiconductor nanostructures 108b. The transistor 106c includes three semiconductor nanostructures 108c. The transistor 108d includes three semiconductor nanostructures 106d. While FIG. 1A includes transistors 106 each having three semiconductor nanostructures 108, in practice, each transistor 106 can have fewer or more semiconductor nanostructures than three without departing from the scope of the present disclosure.

The semiconductor nanostructures 108 of a transistor 106 corresponds to channel regions of the transistor 106. Accordingly, the semiconductor nanostructures 108 may correspond to stacked channel regions of the transistor 106. The semiconductor nanostructures 108 may include one or more layers of Si, Ge, SiGe, GaAs, InSb, GaP, GaSb, InAlAs, InGaAs, GaSbP, GaAsSb or InP. Other semiconductor materials can be utilized for the semiconductor nanostructures 108 without departing from the scope of the present disclosure.

The vertical thickness of the semiconductor nanostructures 108 can be between 2 nm and 15 nm. The length of the semiconductor nanostructures in the X direction may be between 5 nm and 25 nm. The width of the semiconductor nanostructures 108 in the Y direction may be between 4 nm and 10 nm. Other dimensions and materials can be utilized for the semiconductor nanostructures 108 without departing from the scope of the present disclosure.

Each transistor 106 includes a gate electrode 110. During description of the integrated circuit 100, the reference number 110 may be utilized without any suffix (a, b, c, or d) when referring to characteristics of the gate electrodes in general of the transistors 106. The reference number 110 may be utilized with a suffix (a, b, c, or d) when referring to a specific one of the transistors 106a-d. The transistor 106a includes a gate electrode 110a. The transistor 106b includes a gate electrode 110b. The transistor 106c includes a gate electrode 110c. The transistor 106d includes a gate electrode 110d.

Each gate electrode 110 includes a gate metal 114. The gate metal 114 of a gate electrode 110 surrounds the semiconductor nanostructures 108 of the corresponding transistor 106. For this reason, the transistors 106 may be termed "gate all around transistors". The gate metal 114 can include one or more of tungsten, titanium, titanium nitride, tantalum, tantalum nitride, ruthenium, cobalt, aluminum, titanium, or other suitable conductive materials. While the gate metal 114 is shown as a single metal layer, in practice, the gate metal 114 may include multiple metal layers selected to provide a desired threshold voltage for the transistors 106.

Each gate electrode 110 includes a gate cap metal 116. The gate cap metal 116 can include tungsten, cobalt, ruthenium, titanium nitride, titanium, molybdenum, or other suitable conductive materials. The material of the gate cap metal 116 is selected to be different than the material of the gate metal 114 so that the gate cap metal 116 is selectively etchable with respect to the gate metal 114. As will be set forth in more detail below, this assists in the process for selectively electrically isolating two adjacent gate electrodes 110. The gate cap metal 116 may have a vertical thickness between 0.5 nm and 10 nm. Other materials and thicknesses can be utilized for the gate cap metal 116 without departing from the scope of the present disclosure.

As can be seen in FIG. 1A, the gate cap metal 116 extends between the gate metal 114 of the gate electrodes 110a and the gate metal 114 of the gate electrode 110b. Accordingly, the gate cap metal 116 electrically connects or electrically shorts the gate electrode 110a with the gate electrodes 110b. As can be seen in FIG. 1A, the gate cap metal 116 is broken between the gate electrode 110b of the transistor 106b and the gate electrode 110c of the transistor 106c. Accordingly, the gate electrodes 110b and 110c are electrically isolated from each other.

Each transistor 106 includes two source/drain regions 112. Due to the sectional perspective view of the integrated circuit 100 in FIG. 1A, only a single source/drain region 112a of the transistor 106a and a single source/drain region 112d of the of the transistor 106d are apparent. However, in practice, the semiconductor nanostructures 108 of a transistor 106 extend in the X direction between the first source/drain region 112 and a second source/drain region 112. The semiconductor nanostructures 108 of the transistor 106 are in direct contact with the source/drain regions 112 of the transistor 106. Accordingly, if the Y cut of the integrated circuit 100 is taken further along the X axis, then a second source/drain region 112a would be apparent and the extension of the semiconductor nanostructures 108a in the X direction between the two source/drain regions 112a of the transistor 106a would be apparent. Further clarification of this aspect of the transistors 106 will be apparent in relation to FIG. 2A and the corresponding description.

As used herein, the term "source/drain region" may refer to a source or a drain, individually or collectively dependent upon the context. Accordingly, one of the source/drain region 112 of a transistor 106 may correspond to a source region, while a second source/drain region of the transistor 112 may correspond to a drain region.

The source/drain regions 112 of the transistor 106 can be epitaxially grown from one or both of the semiconductor nanostructures 108 and a semiconductor layer (no longer present in FIG. 1A) of the substrate 101. The source/drain regions 112 can include a semiconductor material such as silicon, silicon germanium, or other suitable semiconductor materials. The source/drain regions 112 can be doped with N-type dopants species in the case of N-type transistors. The source/drain regions 112 can be doped with P-type dopant species in the case of P-type transistors. The doping can be performed in-situ during the epitaxial growth.

The transistors 106 include inner spacers 118. In some embodiments, the inner spacers 118 include silicon nitride. However, the inner spacers 118 can include silicon oxide, silicon oxynitride (SiON), SiOCN, SiCN, fluorine-doped silicate glass (FSG), a low-K dielectric material or other dielectric materials without departing from the scope of the present disclosure. The inner spacers isolate the gate electrode 110 of a transistor 106 from the source/drain regions 112. This can help ensure that there are no short circuits between the gate electrode 110 of a transistor 106 and the source/drain regions 112 of the transistor 106.

The transistors 106 include a gate dielectric 117. The gate dielectric 117 physically separates the semiconductor nanostructures 108 from the gate metal 114. Accordingly, the gate dielectric 117 isolates the gate metal 114 from the semiconductor nanostructures 108.

The gate dielectric 117 is shown as only a single layer. However, in practice, the gate dielectric 117 may include multiple dielectric layers. For example, the gate dielectric 117 may include an interfacial dielectric layer that is in direct contact with the semiconductor nanostructures 108. The gate dielectric 117 may include a high-K gate dielectric layer positioned on the interfacial dielectric layer. Together, the interfacial dielectric layer and the high-K gate dielectric layer form a gate dielectric 117 for the transistors 106.

The interfacial dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors. The interfacial dielectric layer can have a thickness between 0.5 nm and 2 nm.

The high-K gate dielectric layer includes one or more layers of a dielectric material, such as $HfO_2$, HfSiO, $SiO_2$, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer may be formed by CVD, ALD, or any suitable method. The thickness of the high-K gate dielectric layer is in a range from about 1 nm to about 3 nm. Other thicknesses and materials can be utilized for the high-K gate dielectric layer without departing from the scope of the present disclosure.

The integrated circuit 100 includes a hard mask layer 119. The hard mask layer 119 corresponds to a mask for forming the gate isolation structures 122, as will be described in further detail below. The hard mask layer 119 is a dielectric material including one or more of SiN, SiOC, AlO, AlON, ZrO, HfO, TiO, ZrAlO, ZnO, SiOCN, SiOCN, SiCN, or other suitable dielectric materials.

The integrated circuit includes a dielectric refill material 126. The dielectric refill material 126 is positioned between the source/drain region 112d of the transistor 106d and the source/drain region 112a of the transistor 106a. As will be described in further detail with respect to FIG. 2B, the dielectric refill material 126 is utilized to fill a trench formed by removal of semiconductor nanostructures that initially extended between the source/drain region 112d and the source/drain region 112a. The dielectric refill material 126 can include SiN, SiOC, AlO, AlON, ZrO, HfO, TiO, ZrAlO, ZnO, SiOCN, SiOCN, SiCN, or other suitable dielectric materials. The dielectric refill material 126 can have a height between 20 nm and 100 nm, though other values can be utilized without departing from the scope of the present disclosure.

The integrated circuit 100 includes a bulk dielectric layer 121. The bulk dielectric layer 121 makes up a majority of the backside substrate 101 after backend processing of the integrated circuit 100. As will be described in further detail with regard to FIG. 2A, the substrate 101 may initially include a semiconductor substrate and shallow trench isolation regions. After front end processing of the integrated circuit 100 is complete, the integrated circuit 100 is flipped so that the backside 104 faces upward. The semiconductor substrate and the shallow trench isolation regions are removed and the hard mask layers 119 and the bulk dielectric layer 121 are formed. The bulk dielectric layer 121 can include SiN, SiO, SiO$_2$, SiOC, AlO, AlON, ZrO, HfO, TiO, ZrAlO, ZnO, SiOCN, SiOCN, SiCN, or other suitable dielectric materials. The final thickness of the bulk dielectric layer 121 may be between 20 nm and 100 nm, though other thicknesses can be utilized without departing from the scope of the present disclosure.

In some embodiments, the integrated circuit 100 includes a dielectric liner layer 120. The dielectric liner layer 120 lines portions of the gate metal 114, the gate cap metal 116, and the hard mask layer 119. As will be described in further detail with regard to FIG. 2L, a backside etching process is performed to remove large amounts of the gate metal 114. In order to inhibit oxidation of exposed portions of the gate metal 114 after the backside etching process, the dielectric liner layer 120 may be deposited. The dielectric liner layer 120 can include SiN, SiCN, or other suitable dielectric materials. In some embodiments, the dielectric liner layer 120 is not present.

The portions of the bulk dielectric layer 121 and dielectric liner layer 120 between adjacent gate electrodes 110 correspond to backside gate isolation structures 122. The backside gate isolation structures 122 can electrically isolate adjacent gate electrodes 110 in those instances in which the gate cap metal 116 is cut, exposing the interlevel dielectric layer 132. In other cases, the gate cap metal 116 is not cut and adjacent gate electrodes 110 remain electrically connected. However, in both cases, a large amount of the gate metal 114 is removed. This can substantially reduce capacitive coupling between the gate metal 114 and adjacent conductive structures, such as source/drain contacts 138. The reduction in capacitance is more apparent in relation to FIGS. 1B, 1E, and 1F.

The integrated circuit 100 can include an interlevel dielectric layer 132. The interlevel dielectric layer 132 is formed prior to flipping the integrated circuit 100 for backend processing. The interlevel dielectric layer 132 may be formed on the gate cap metal 116 and other exposed features. The interlevel dielectric layer 132 can include SiN, SiO, SiO$_2$, SiOC, AlO, AlON, ZrO, HfO, TiO, ZrAlO, ZnO, SiOCN, SiOCN, SiCN, or other suitable dielectric materials.

The integrated circuit 100 can include a dielectric layer 134 on the interlevel dielectric layer 132. The dielectric layer 134 may be formed prior to backend processing by depositing the dielectric layer 134 on the interlevel dielectric layer 132. The dielectric layer 134 can include SiN, SiO, SiO$_2$, SiOC, AlO, AlON, ZrO, HfO, TiO, ZrAlO, ZnO, SiOCN, SiOCN, SiCN, or other suitable dielectric materials.

The integrated circuit 100 includes front side source/drain contacts 138. The front side source/drain contacts 138 are electrically connected to the source/drain regions 112a and 112d. The front side source/drain contacts 138 are formed during front end processing prior to flipping the integrated circuit 100 for backend processing. The front side source/drain contacts 138 can include W, Ru, Mo, Co, TiN, or other suitable conductive materials. Though not shown in FIG. 1A, contact liners 139 may line the sidewalls of the source/drain contacts 138. The contact liners 139 may have a thickness between 1 nm and 10 nm and may include SiN, SiOC, AlO, AlON, ZrO, HfO, TiO, ZrAlO, ZnO, SiOCN, SiOCN, SiCN, or other suitable dielectric materials.

The integrated circuit 100 includes backside conductive vias 140. The backside conductive vias extend through the bulk dielectric layer 121 and the hard mask layer 119 to contact source/drain regions 112. The backside conductive vias 140 can include W, Ru, Mo, Co, TiN, or other conductive materials that may have a height between 5 nm and 50 nm. Other materials and dimensions may be used for the backside conductive vias 140 without departing from the scope of the present disclosure. The backside conductive vias may include liner layers 141. The liner layers 141 may include SiN, SiOC, AlO, AlON, ZrO, HO, TiO, ZrAlO, ZnO, SiOCN, SiOCN, SiCN, or other suitable dielectric materials and may have a thickness between 1 nm and 10 nm. Other materials and thicknesses can be utilized for the liner layers 141 without departing from the scope of the present disclosure.

Figure 1B:
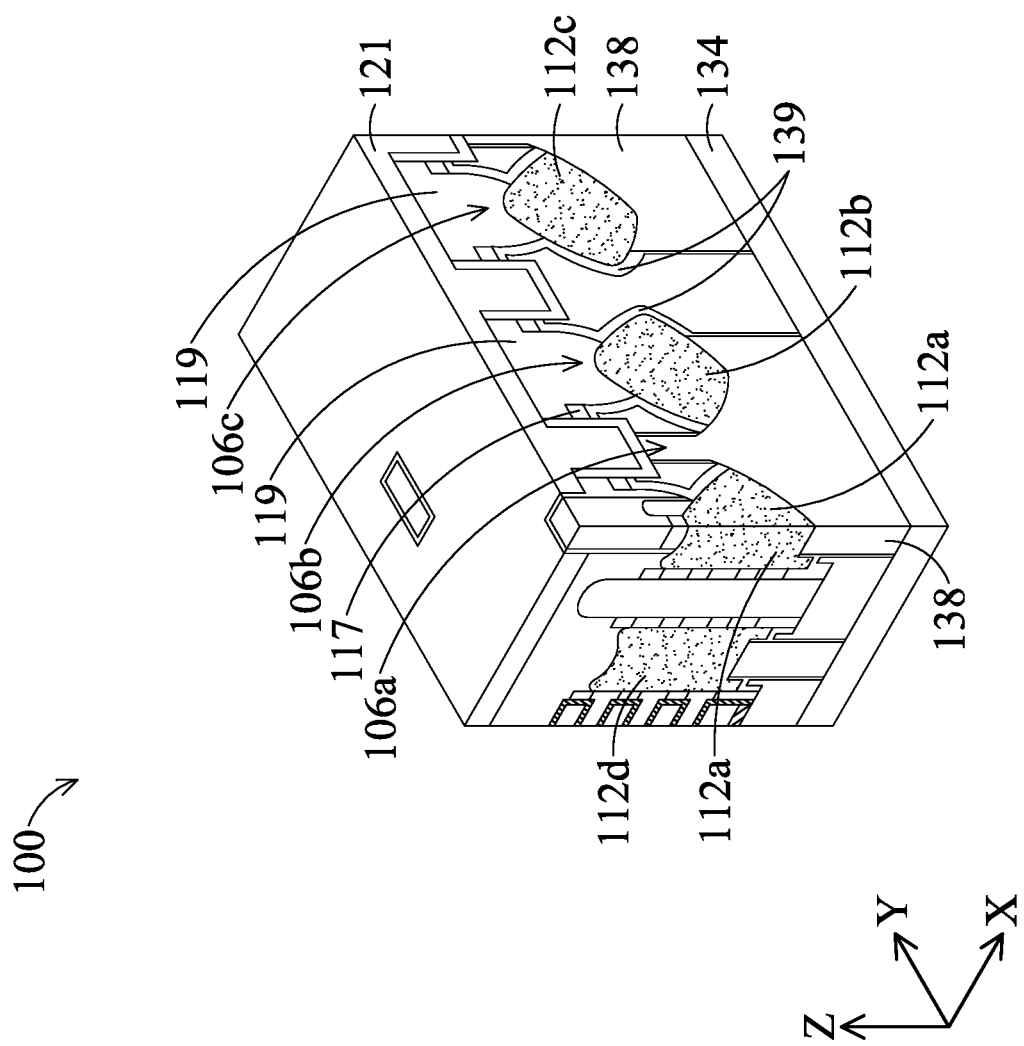

FIG. 1B is a perspective view of the integrated circuit 100 of FIG. 1A with a section taken along cut lines B of FIG. 1A, in accordance with some embodiments. The section exposes a Y-Z plane taken through the source/drain contact 138 that contacts the source/drain region 112a of the transistor 106a. This view also exposes one of the source/drain regions 112b of the transistor 106b, and one of the source/drain regions 112c of the transistor 106c. This view also exposes a portion of a source/drain contact 138 that contact the source/drain region 112c.

As can be seen in the view of FIG. 1B, the source/drain contacts 138 are relatively wide in the Y direction and are deep in the Z direction. The source/drain contacts 138 have a large surface area in the Y-Z plane adjacent to the gate metal 114 of the gate electrodes 110 and separated from the gate metal 114 by a relatively short distance in the X direction. Because the gate isolation structures 122 have been formed, the surface area of the gate metal 114 in the Y-Z plane is greatly reduced. This has the effect of greatly reducing the capacitive coupling between the gate metal 114 and the source/drain contacts 138. This is further apparent with respect to FIGS. 1E and 1F. FIG. 1B also illustrates the dielectric layer 139 on the source/drain regions 112. The dielectric layer 139 can be a contact etch stop layer and may include SiN or another suitable dielectric layer.

Figure 1C:
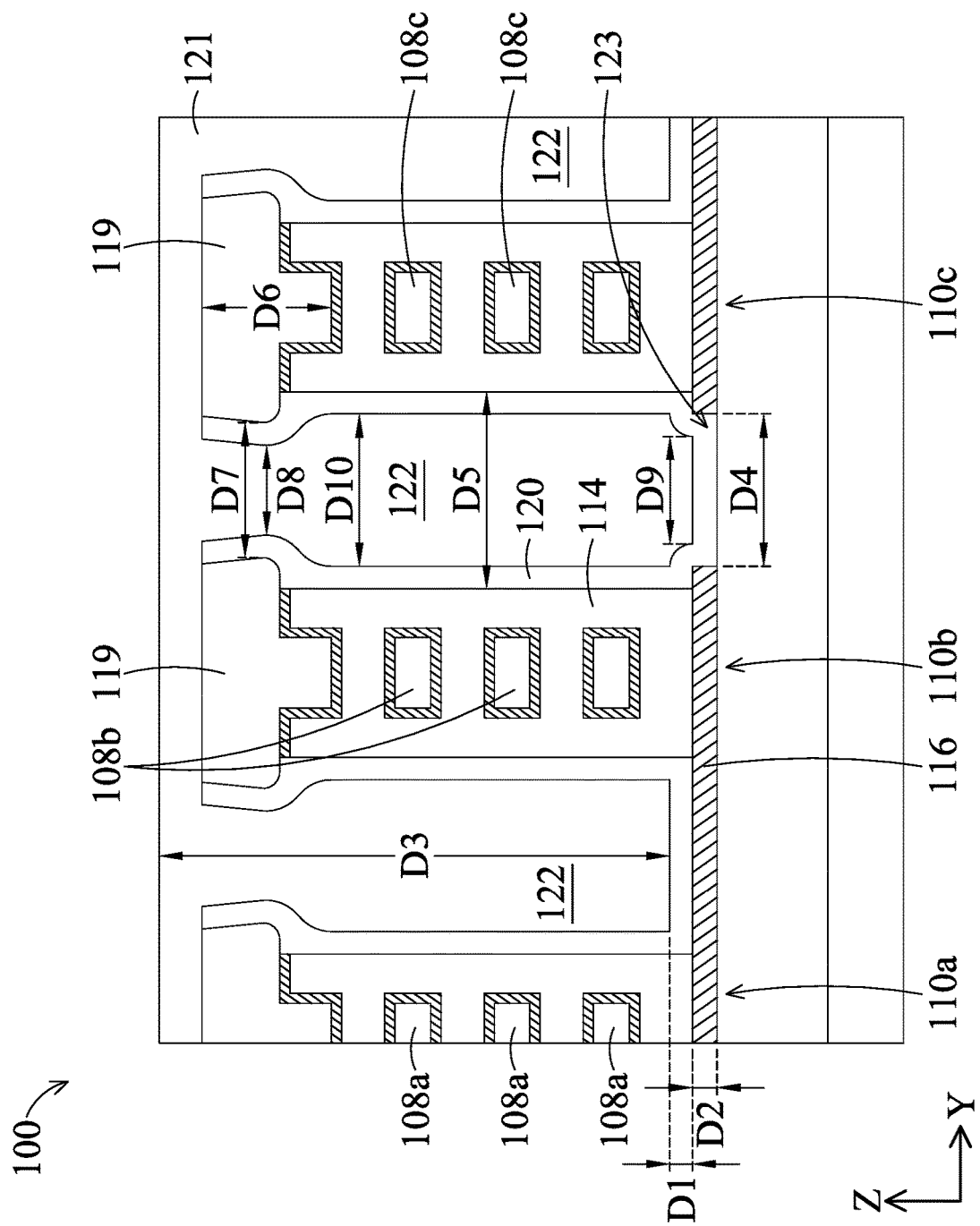
FIGS. 1C-1D are cross-sectional views of the integrated circuit of FIGS. 1A-1B, in accordance with some embodiments.

FIG. 1C is a cross-sectional view of the integrated circuit 100 of FIG. 1A, in accordance with some embodiments. The view of FIG. 1A corresponds to the exposed Y-Z plane of FIG. 1A. The dielectric liner layer 120 has a thickness dimension D1 between 1 nm and 30 nm. The gate cap metal 116 has a thickness dimension D2 between 0.5 nm and 10 nm. The bulk dielectric layer 121 has a thickness dimension between 20 nm and 100 nm. A gap in the gate cap metal 116 between the gate electrodes 110b and 110c has a width dimension D4 between 5 nm and 100 nm. Adjacent portions of the gate metals 114 of the gate electrodes 110b and 110c are separated by a dimension D5 between 5 nm and 100 nm. The hard mask layer 119 has a thickness dimension D6 between 5 nm and 50 nm. The dimensions D1-D6 can have other values without departing from the scope of the present disclosure.

In some embodiments, the hard mask layer 119 defines openings having a dimension D7. The dimension D7 may be between 5 nm and 100 nm. As will be described in greater detail below, the hard mask layer 119 is utilized as a mask to form breaks 123 in the gate cap metal 116, prior to deposition of the dielectric layers 120 and 121. Accordingly, the break 123 in the gate cap metal may have a dimension D4 that is substantially identical to the dimension D7.

In some embodiments, the backside gate isolation structures 122 do not have a uniform width. This is based, in part, on the fact that in some embodiments the hard mask layer 119 has an opening dimension D7 that is less than the dimension D5. After deposition of the dielectric layers 120 and 121, the dielectric layer 121 has a dimension D8 at the openings in the hard mask layer 119, a dimension D10 between the adjacent portions of the gate metal 114, and a dimension D9 near the break 123. The dimensions D8 and D9 may be substantially identical and may have a range 10 nm and 45 nm. The dimension D10 may have a value between 10 nm and 95 nm. Other values for the dimensions D7-D10 may be utilized without departing from the scope of the present disclosure.

In some embodiments, the backside gate isolation structure 122 between the gate electrodes 110a and 110b may have a substantially uniform width below the hard mask layer 119 because there is no break in the gate cap metal 116 at this location. Furthermore, the gate isolation structure 122 between the gate electrodes 110b and 110c may have a depth that is greater than the depth of the gate isolation structure 122 between the gate electrodes 110a and 110b by a value corresponding to the thickness of the gate cap metal 116.

Figure 1D:
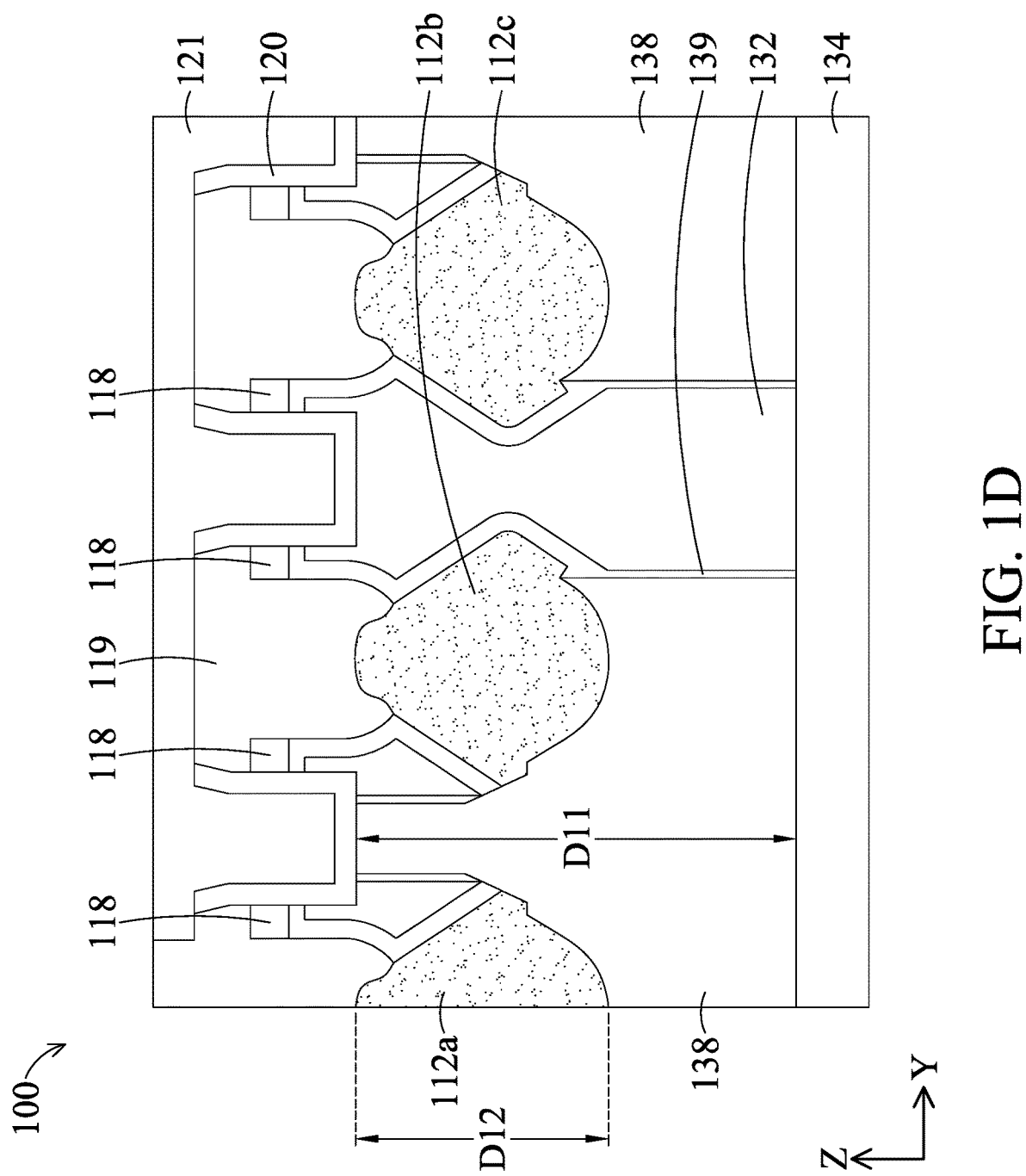

FIG. 1D is a cross-sectional view of the integrated circuit 100 of FIG. 1B, in accordance with some embodiments. The view of FIG. 1D corresponds to the exposed Y-Z plane of FIG. 1B. FIG. 1B illustrates that the source/drain contacts 138 have a height dimension D11 between 10 nm and 100 nm.

In some embodiments, the source/drain contacts 138 extend from the layer 134 to the layer 120. Accordingly, the source/drain contacts 138 may have an upper surface or maximum vertical extension level with or higher than a highest vertical portion of the source/drain regions 112.

In some embodiments, the source/drain regions 112 have a vertical dimension D12. The dimension D12 may be between 10 nm and 50 nm, though other dimensions can be utilized without departing from the scope of the present disclosure. In some embodiments, the source/drain regions contacts 138 may extend to a level approximately D12/2 from a bottom of the source/drain regions 112.

Figure 1F:
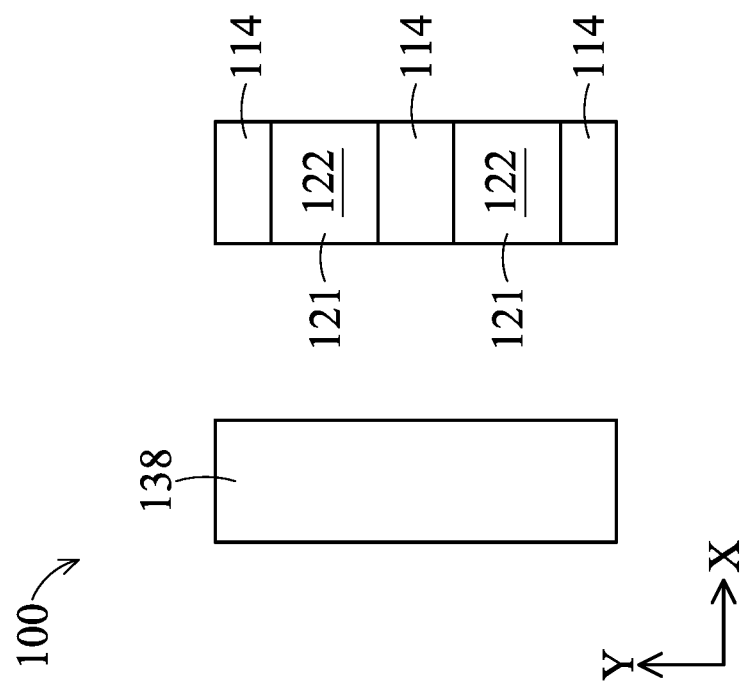
FIGS. 1E-1F are simplified top views of the integrated circuit of FIGS. 1A-1B, in accordance with some embodiments.
Figure 1E:
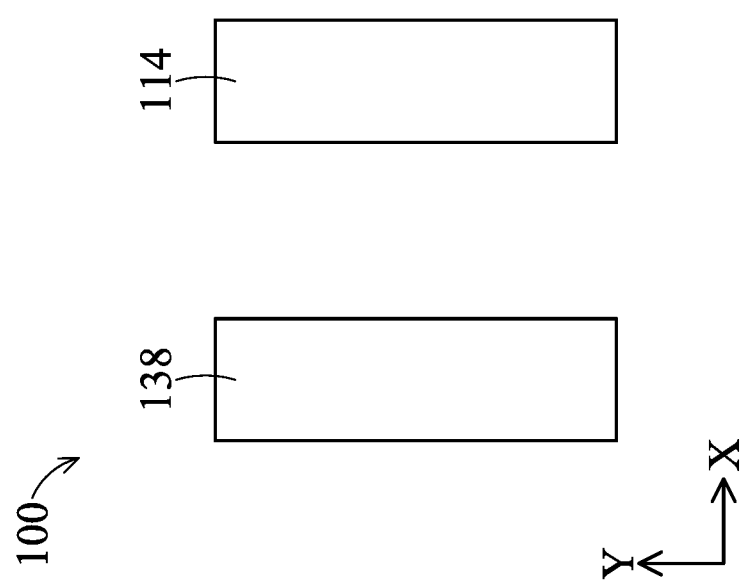

FIG. 1E is a simplified top view of the source/drain contact 138 and the gate metal 114 of the integrated circuit 100 of FIG. 1A, before formation of the backside gate isolation structures 122, in accordance with some embodiments. No other materials or structures of the integrated circuit 100 are shown in FIG. 1E, and the shapes of the source/drain contact 138 and the gate metal 114 are simplified for illustrative purposes. As can be seen in FIG. 1E, for the length of the source/drain contact 138 in the Y direction, a large length of the gate metal 114 is directly across from the source/drain contact 138. This generally results in a high capacitance between the gate metal 114 and the source/drain contact 138.

FIG. 1F corresponds to the same view of the integrated circuit 100 of FIG. 1E, but after formation of the backside gate isolation structures 122, in accordance with some embodiments. As can be seen in FIG. 1F, due to the presence of the gate isolation structures 122 including the bulk dielectric layer 121 between adjacent portions of the gate metal 114, there is a greatly reduced total length of the gate metal 114 and the Y direction directly across from the source/drain contact 138. The result is a large reduction capacitance between the gate metal 114 and the source/drain contact 138.

Figure 2A:
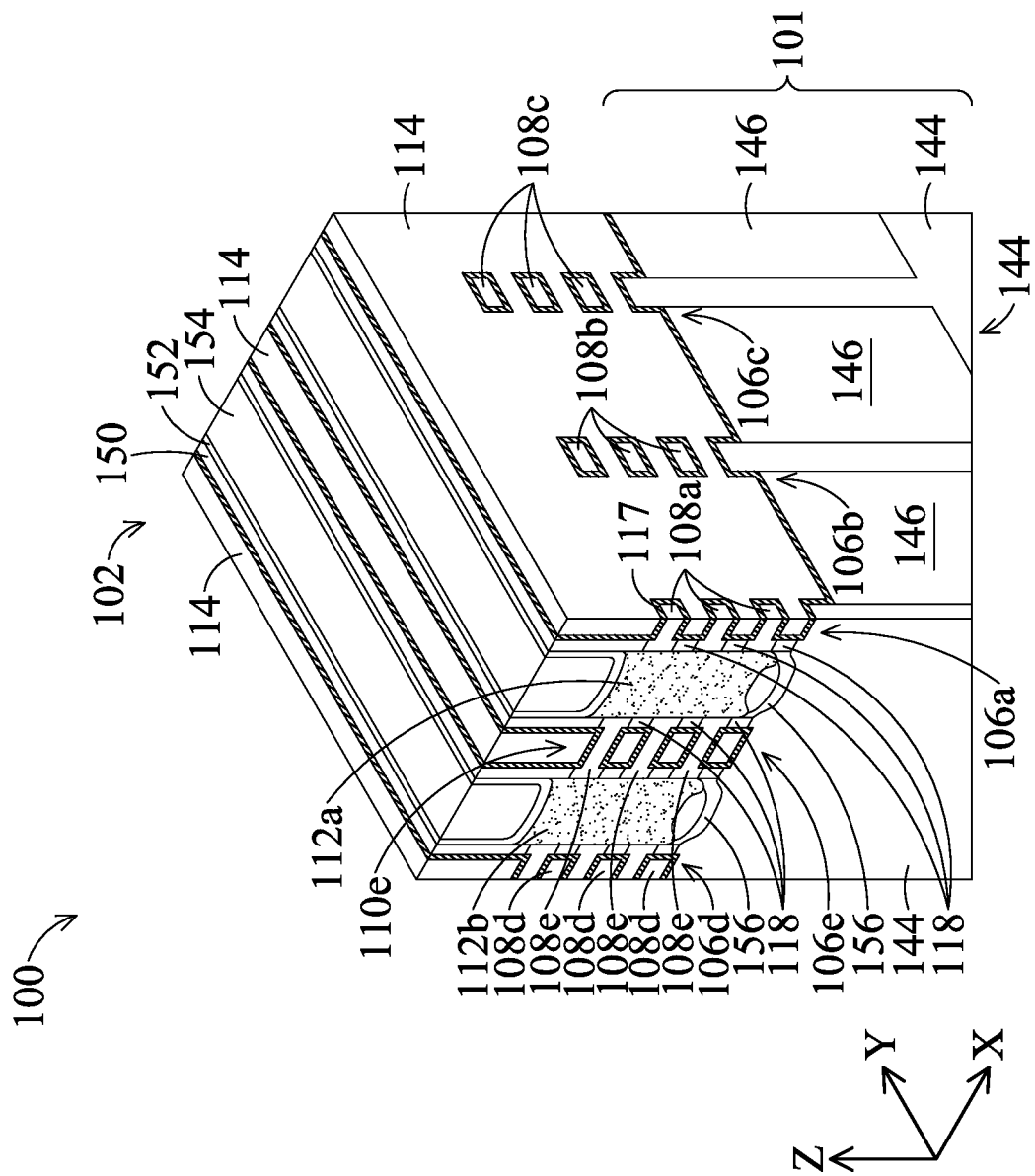
FIGS. 2A-2R are perspective and cross-sectional views of an integrated circuit at various stages of processing, in accordance with some embodiments.
Figure 2B:
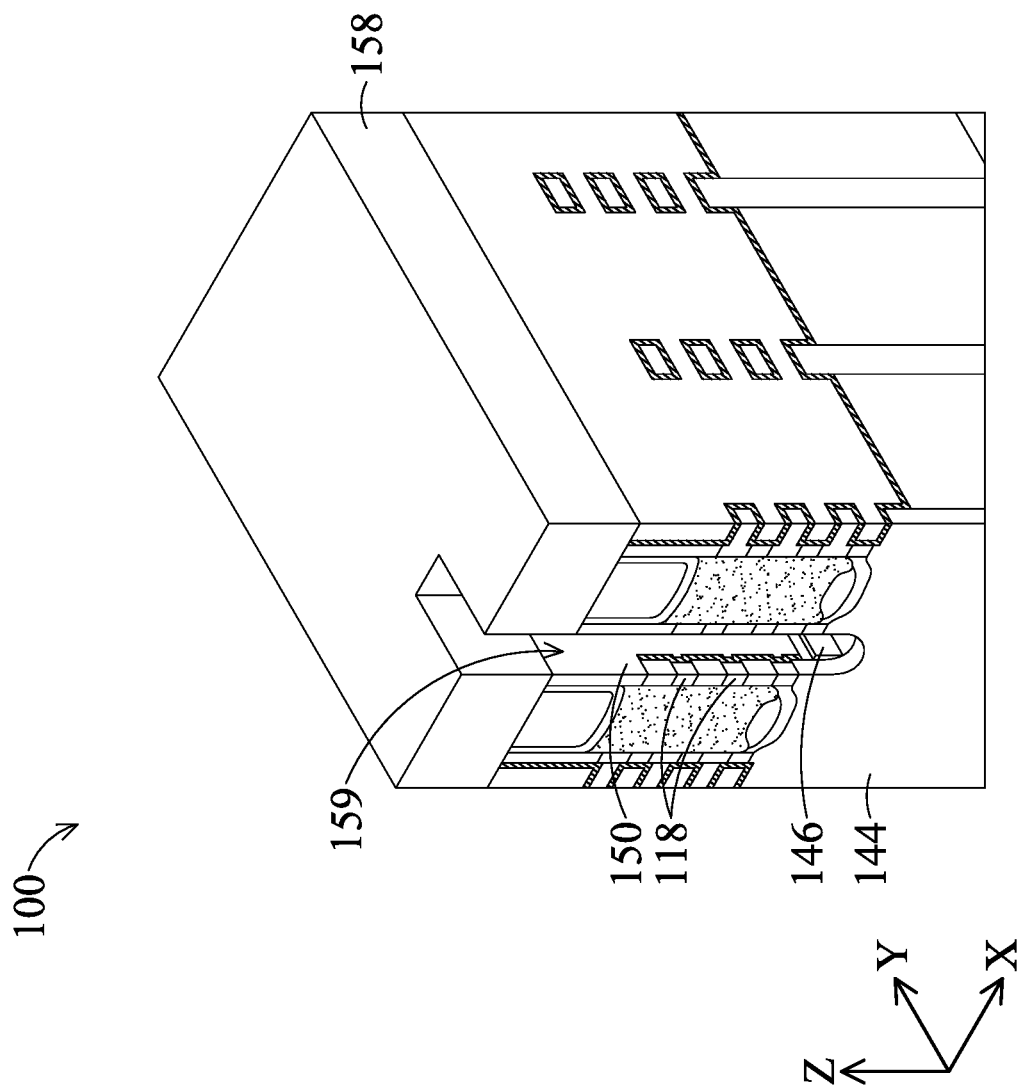
FIG. 2S is a cross-sectional view of a source/drain region of the integrated circuit of FIG. 2R, in accordance with some embodiments.
Figure 2C:
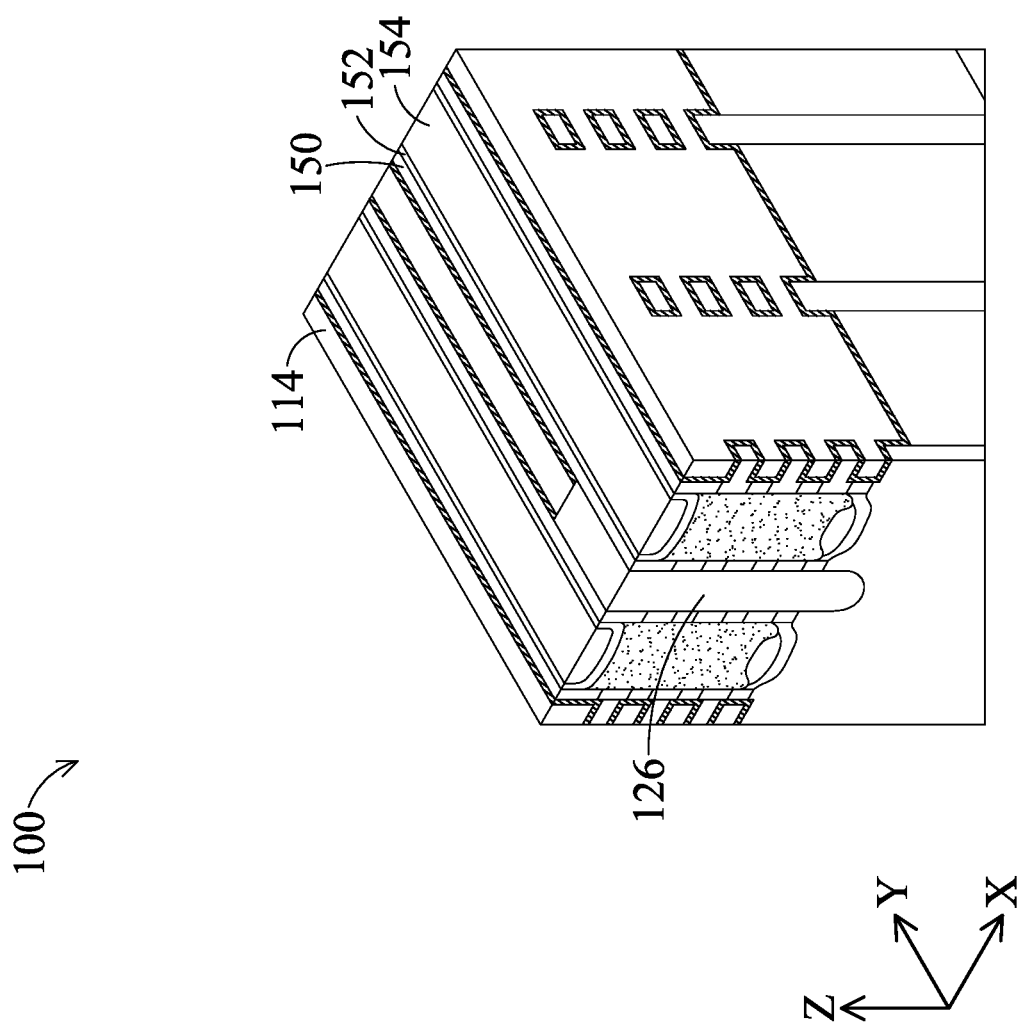
Figure 2D:
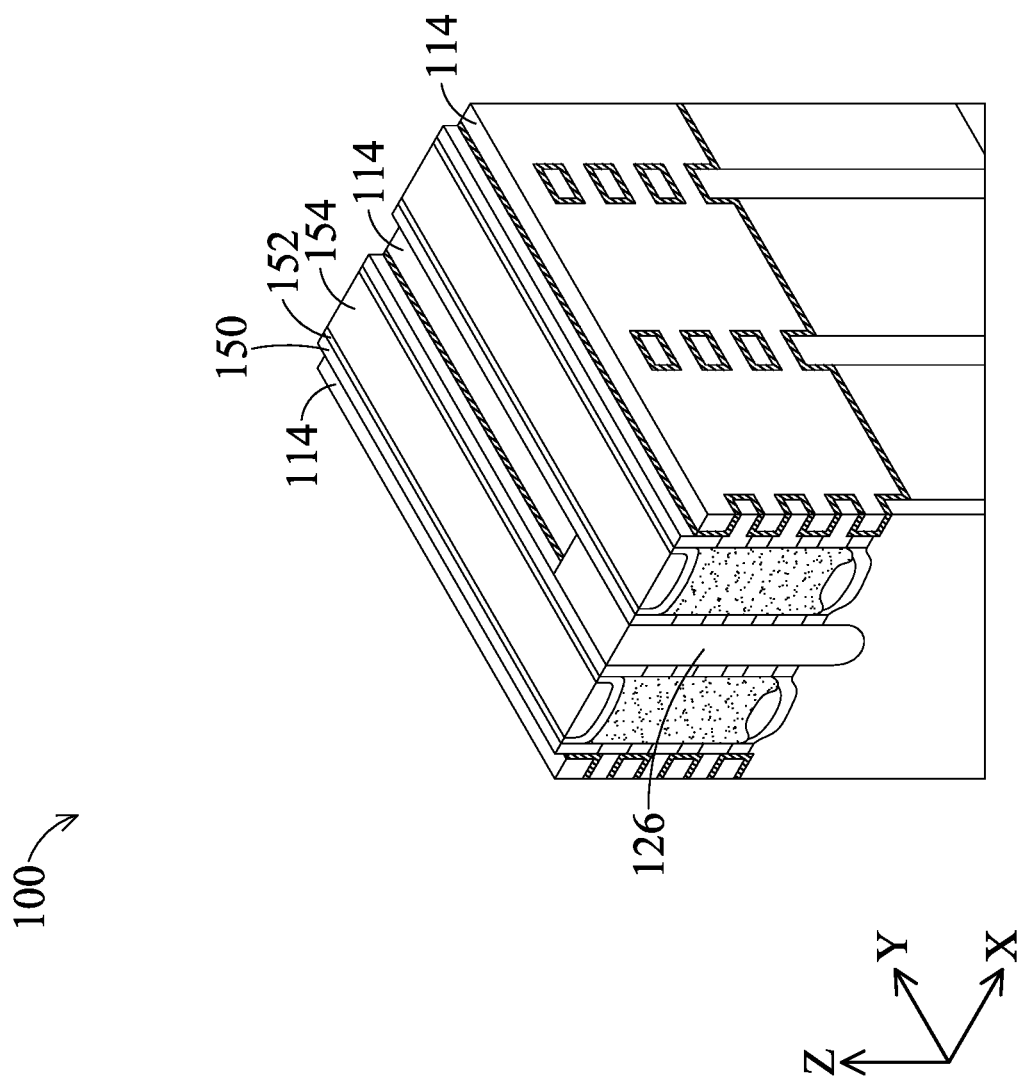
Figure 2E:
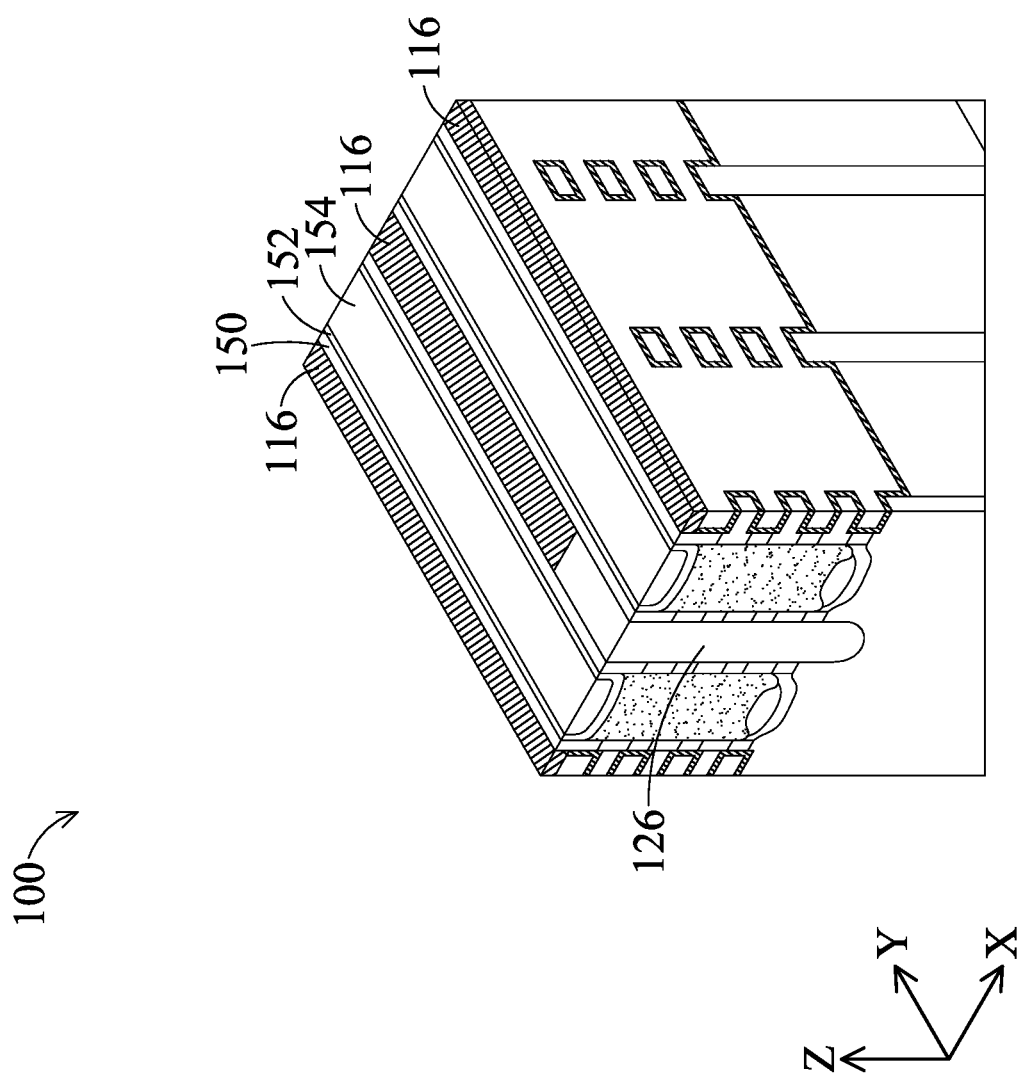
Figure 2F:
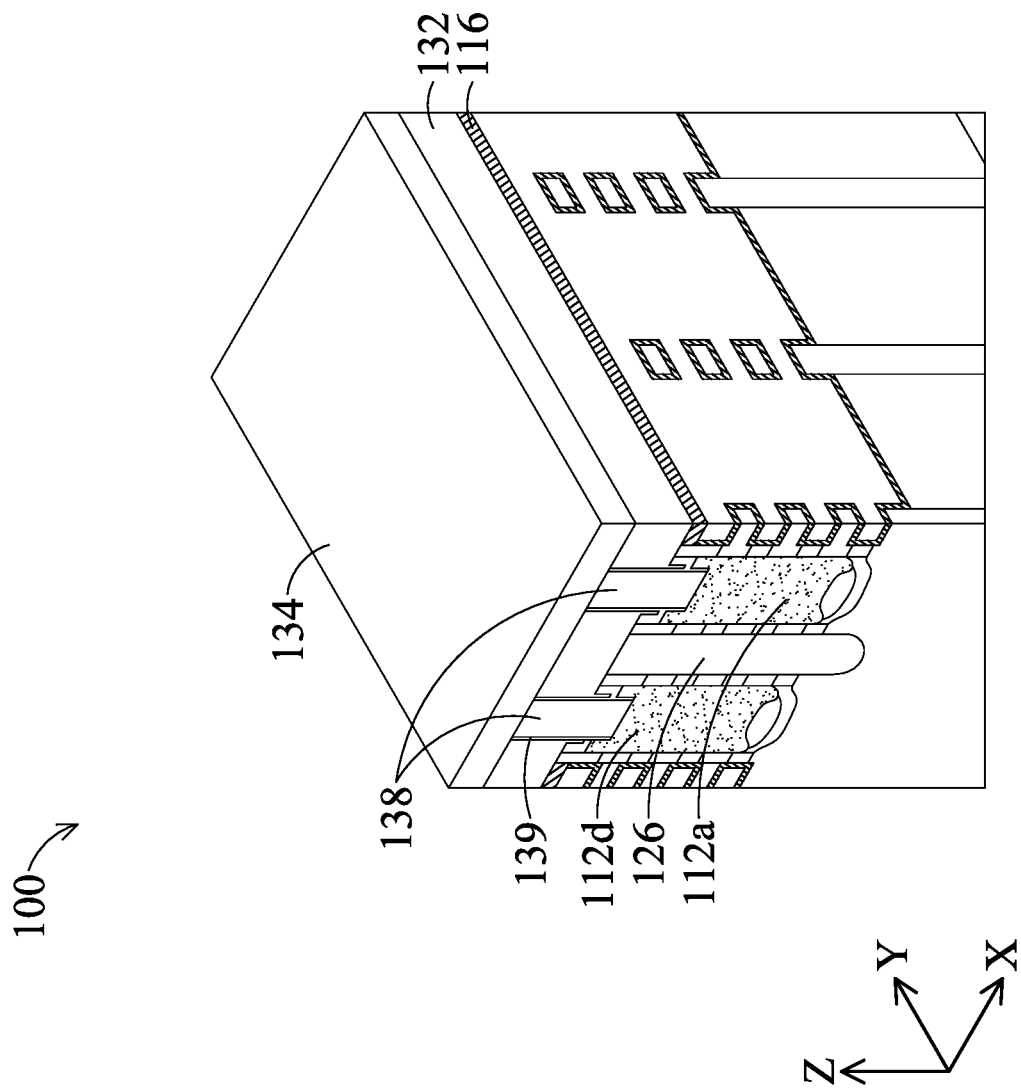
Figure 2G:
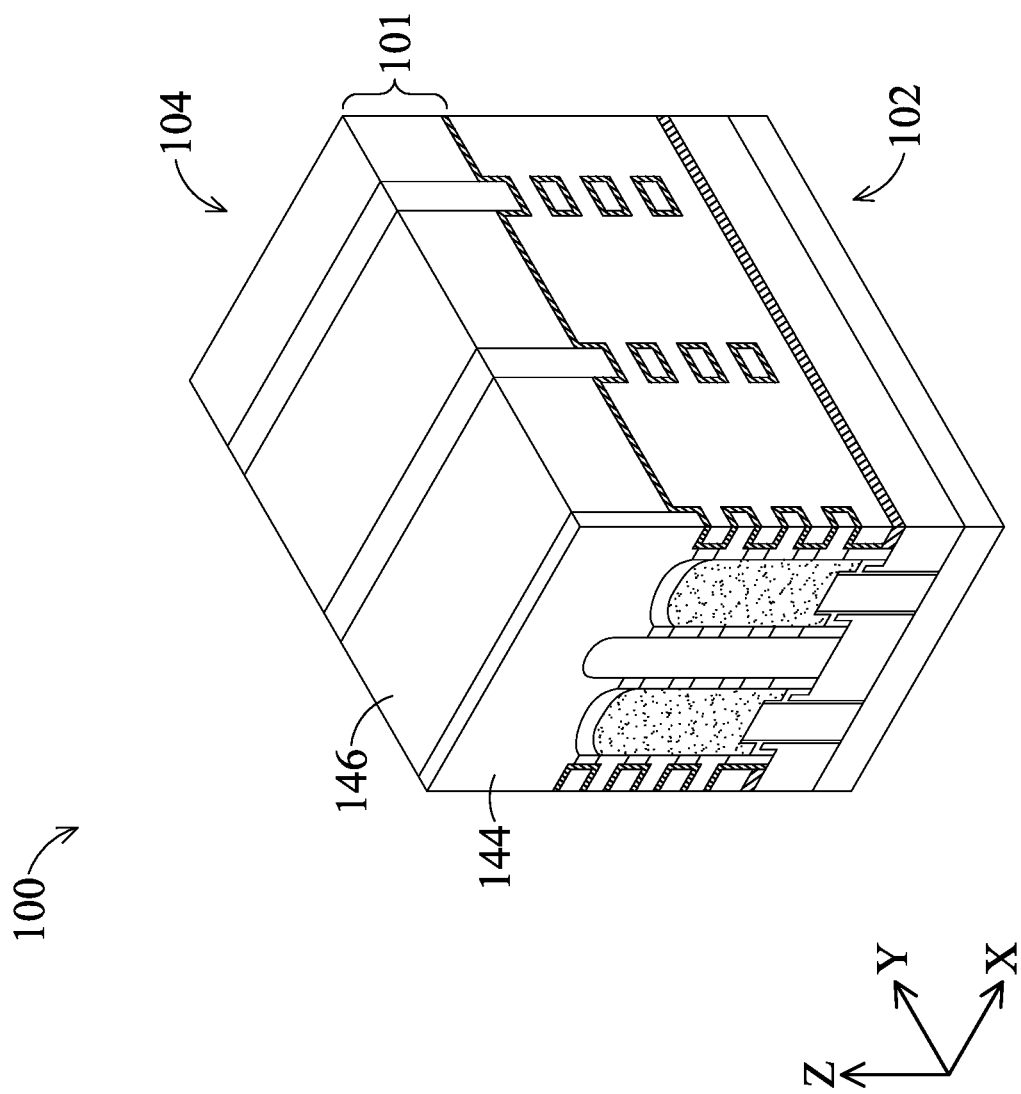
Figure 2H:
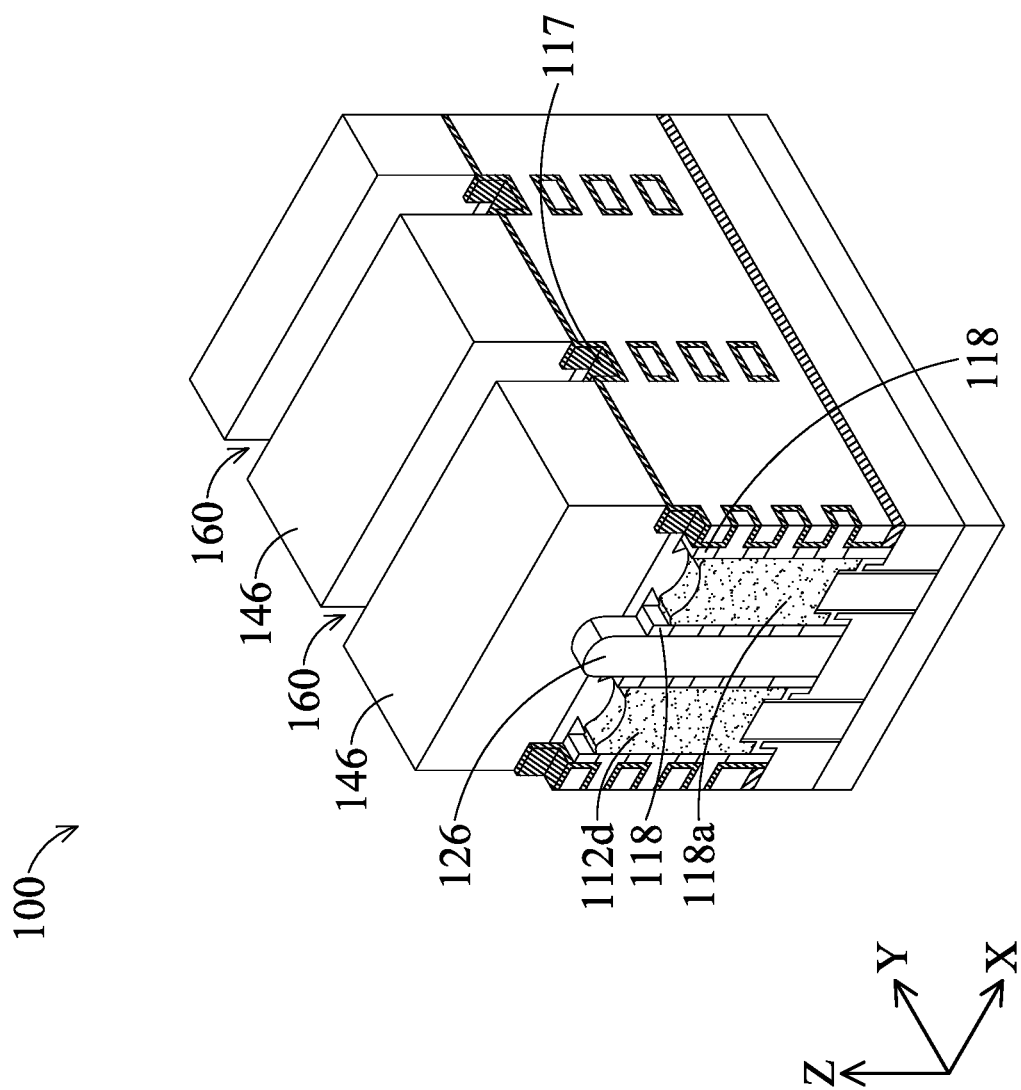
Figure 2I:
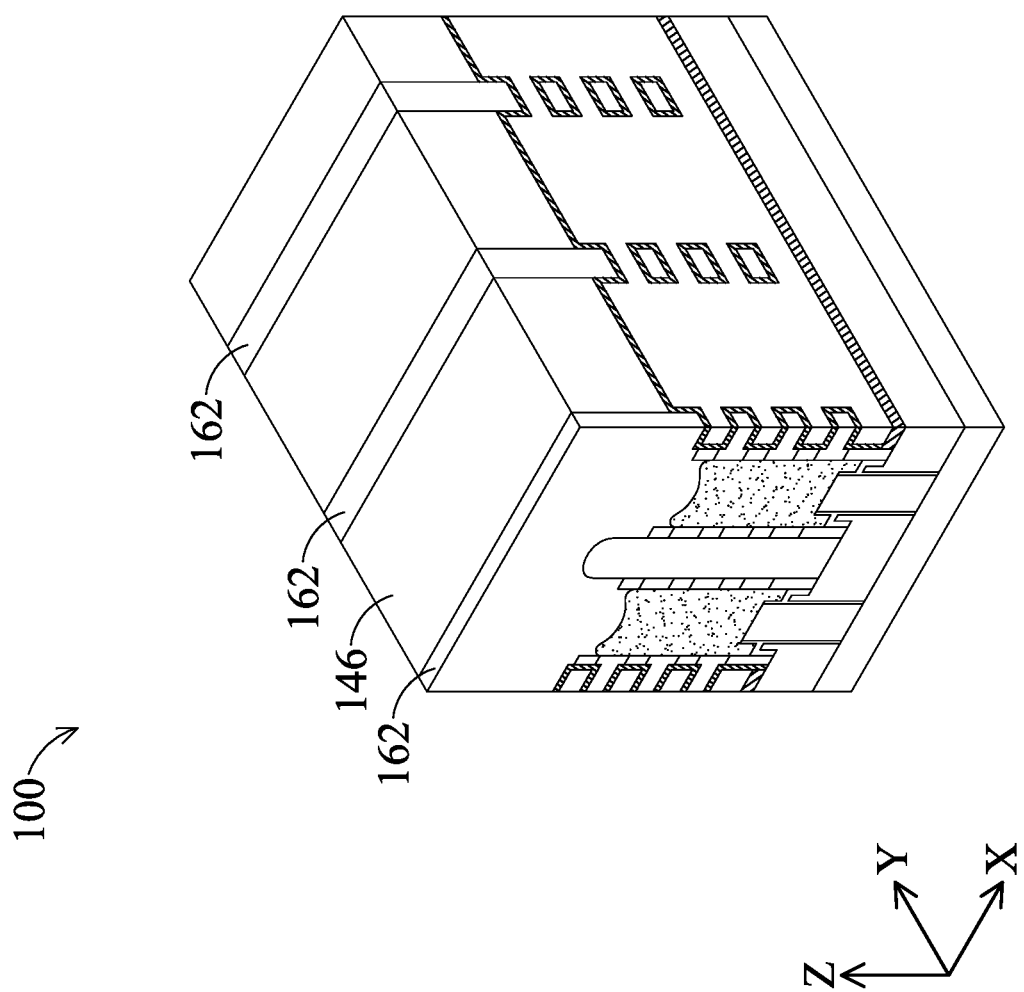
Figure 2J:
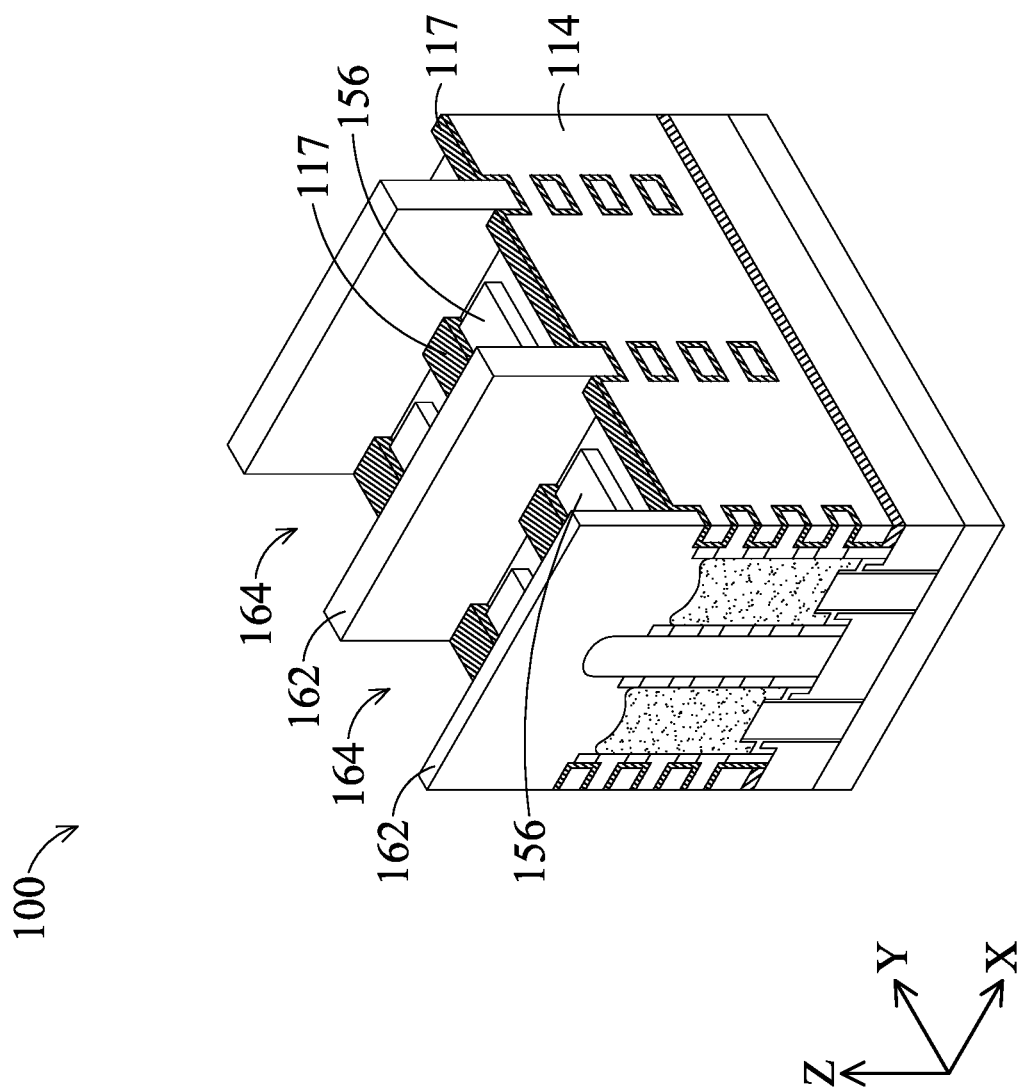
Figure 2K:
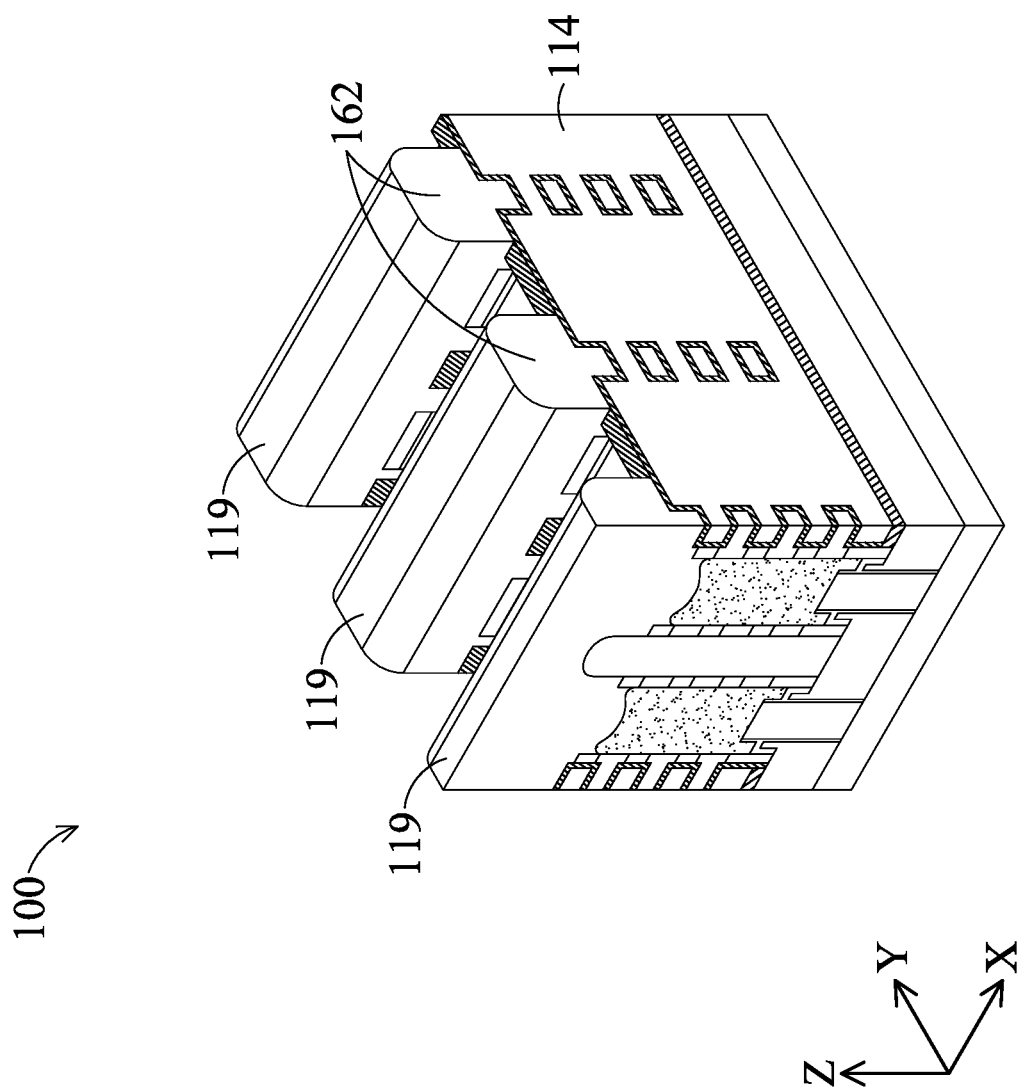
Figure 2L:
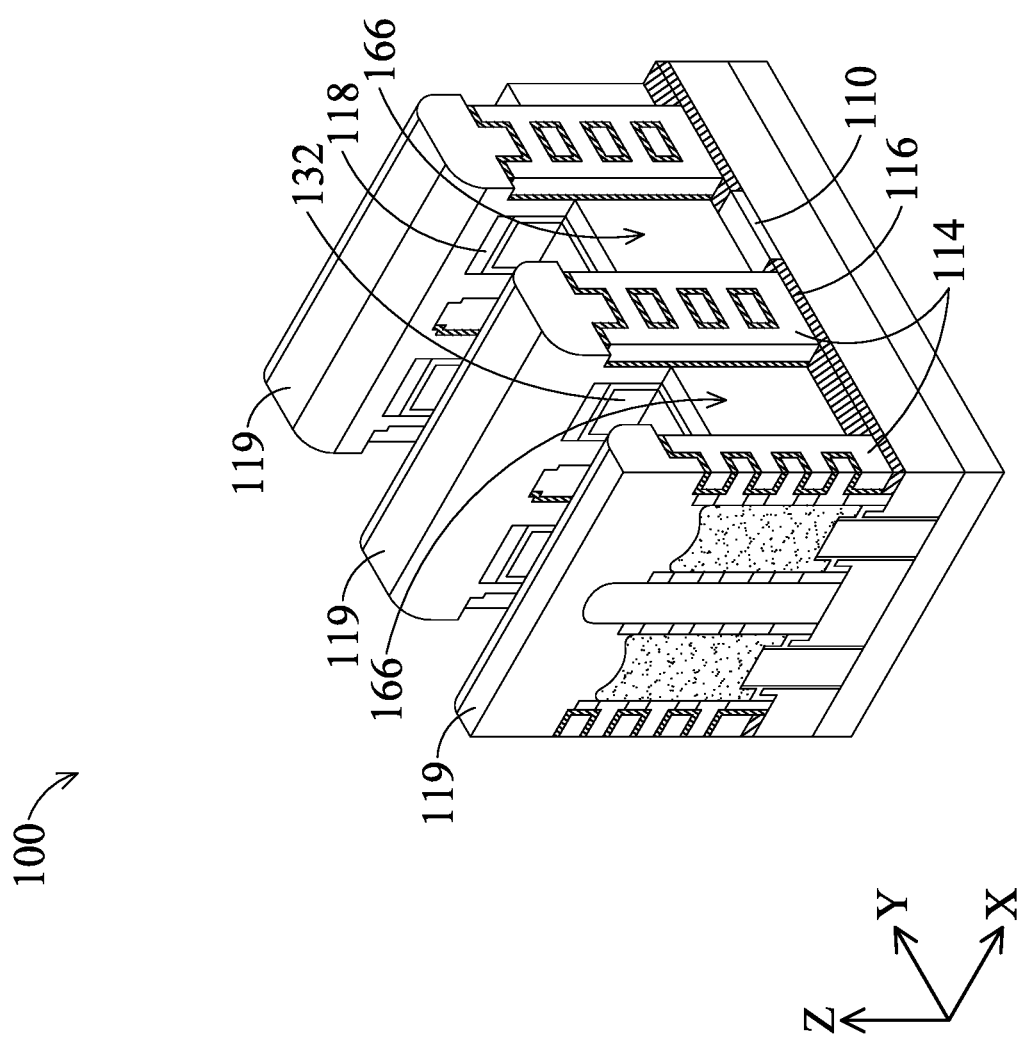
Figure 2M:
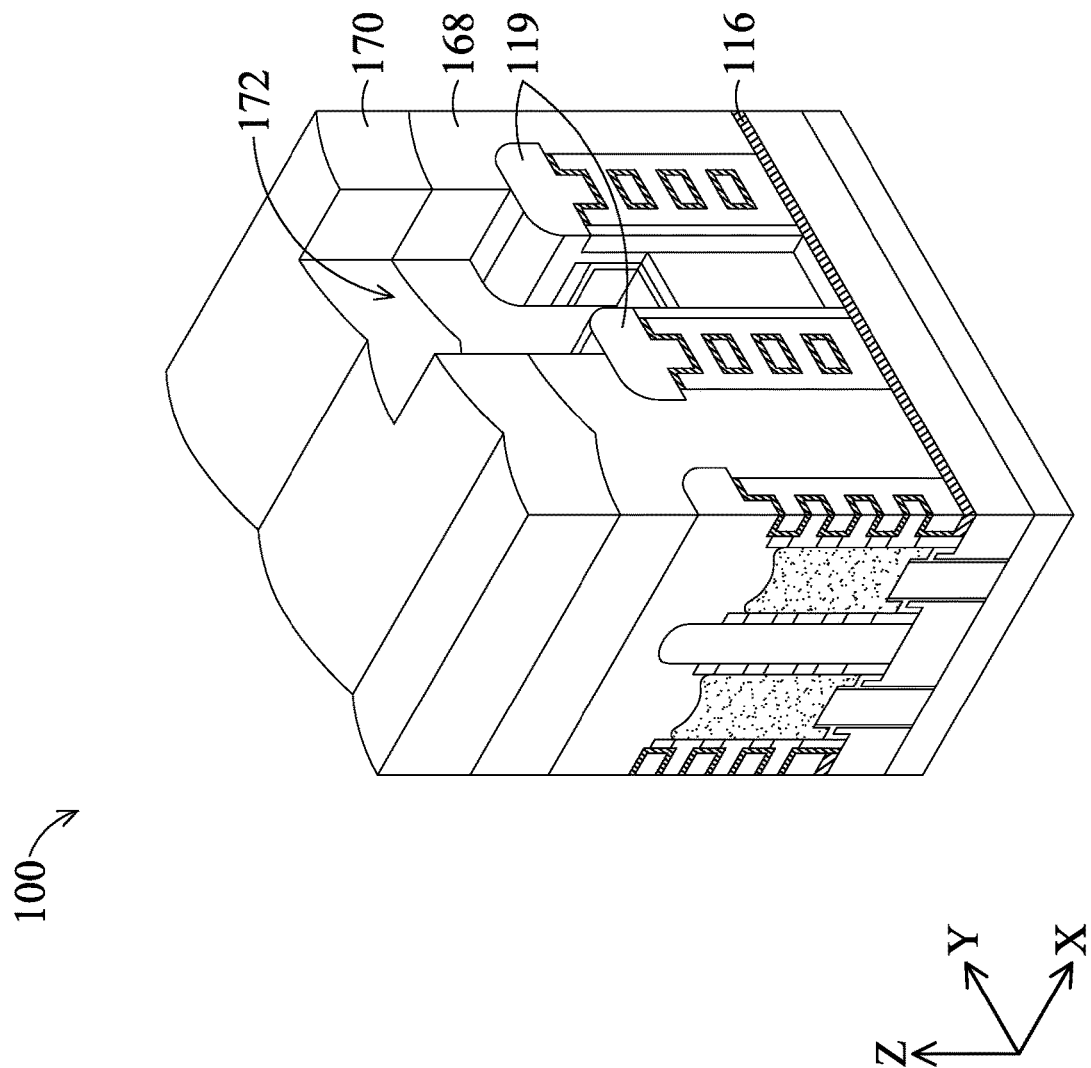
Figure 2N:
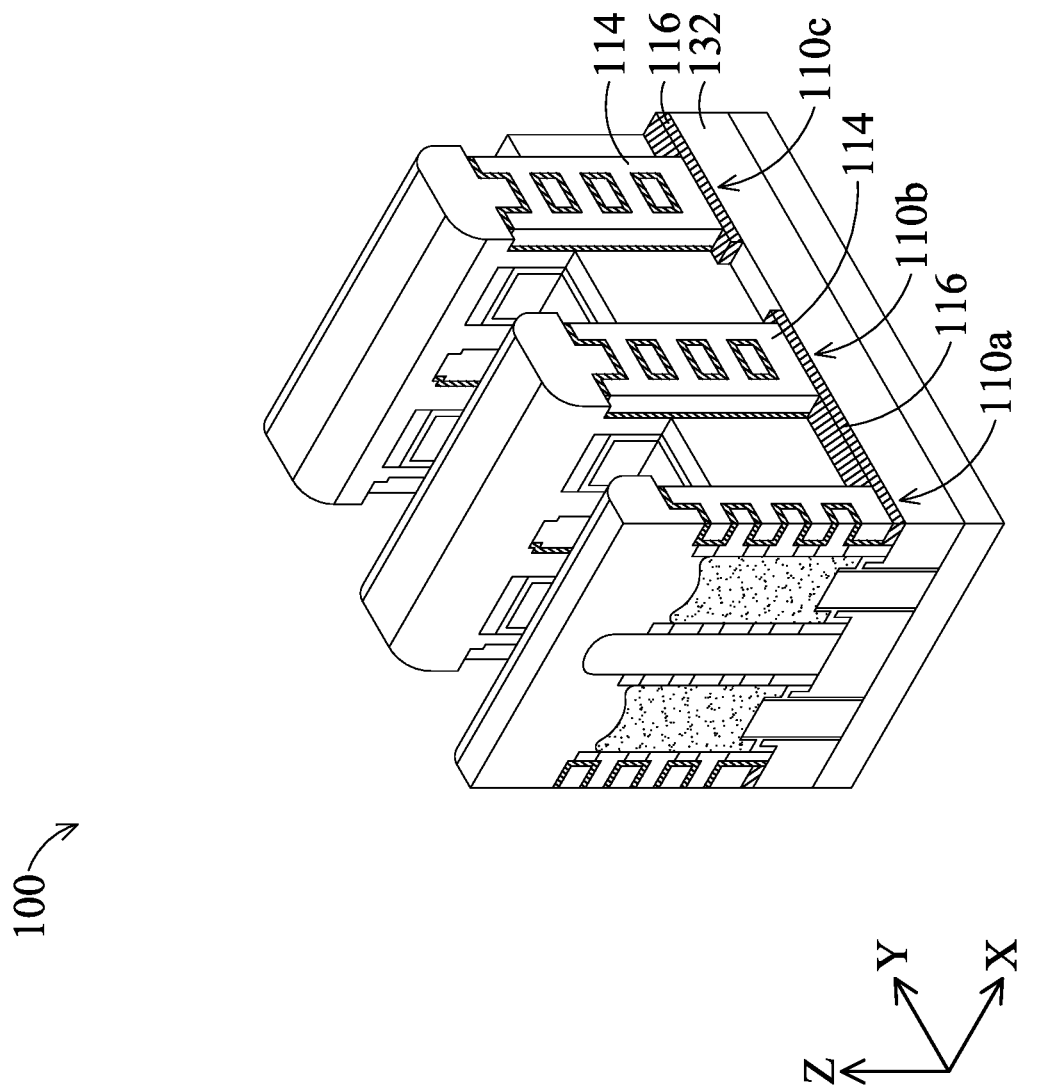
Figure 2O:
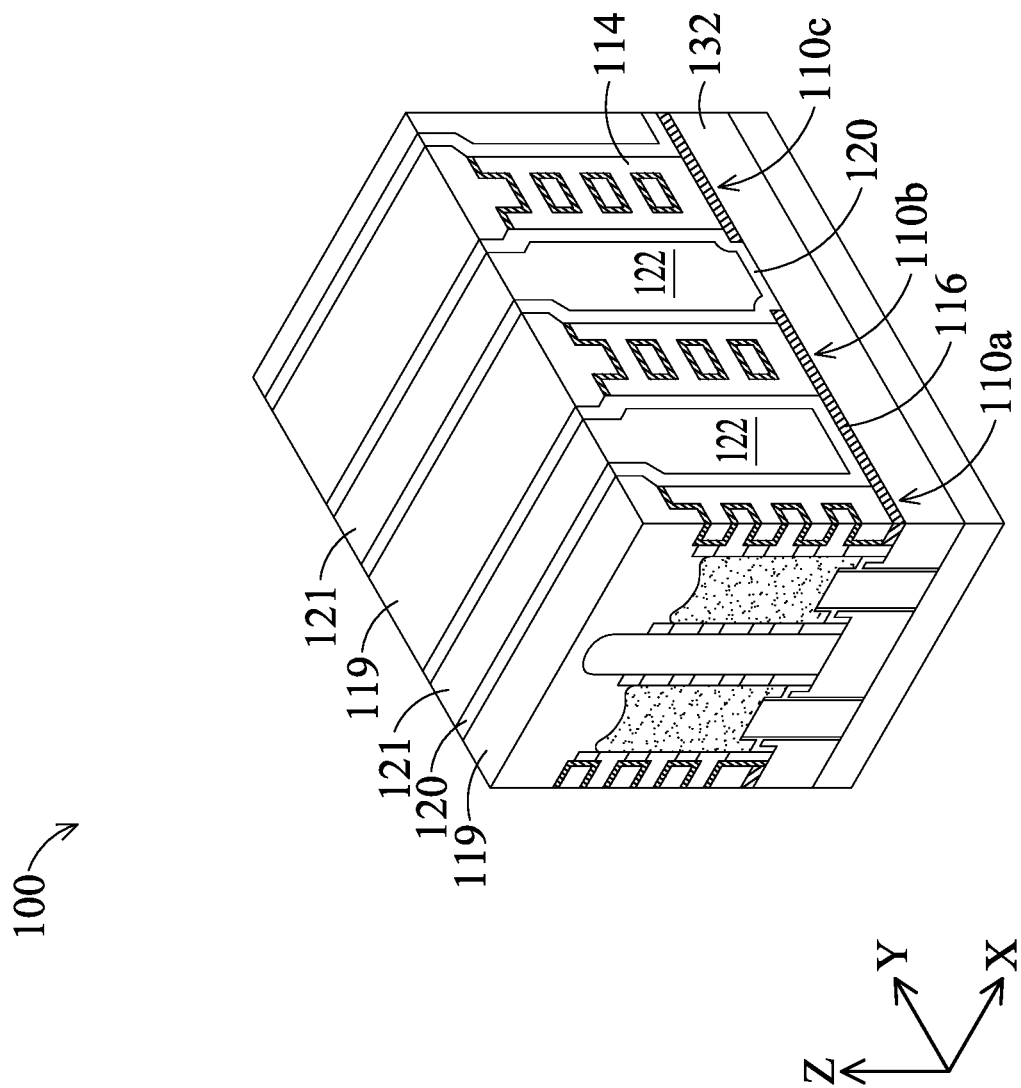
Figure 2P:
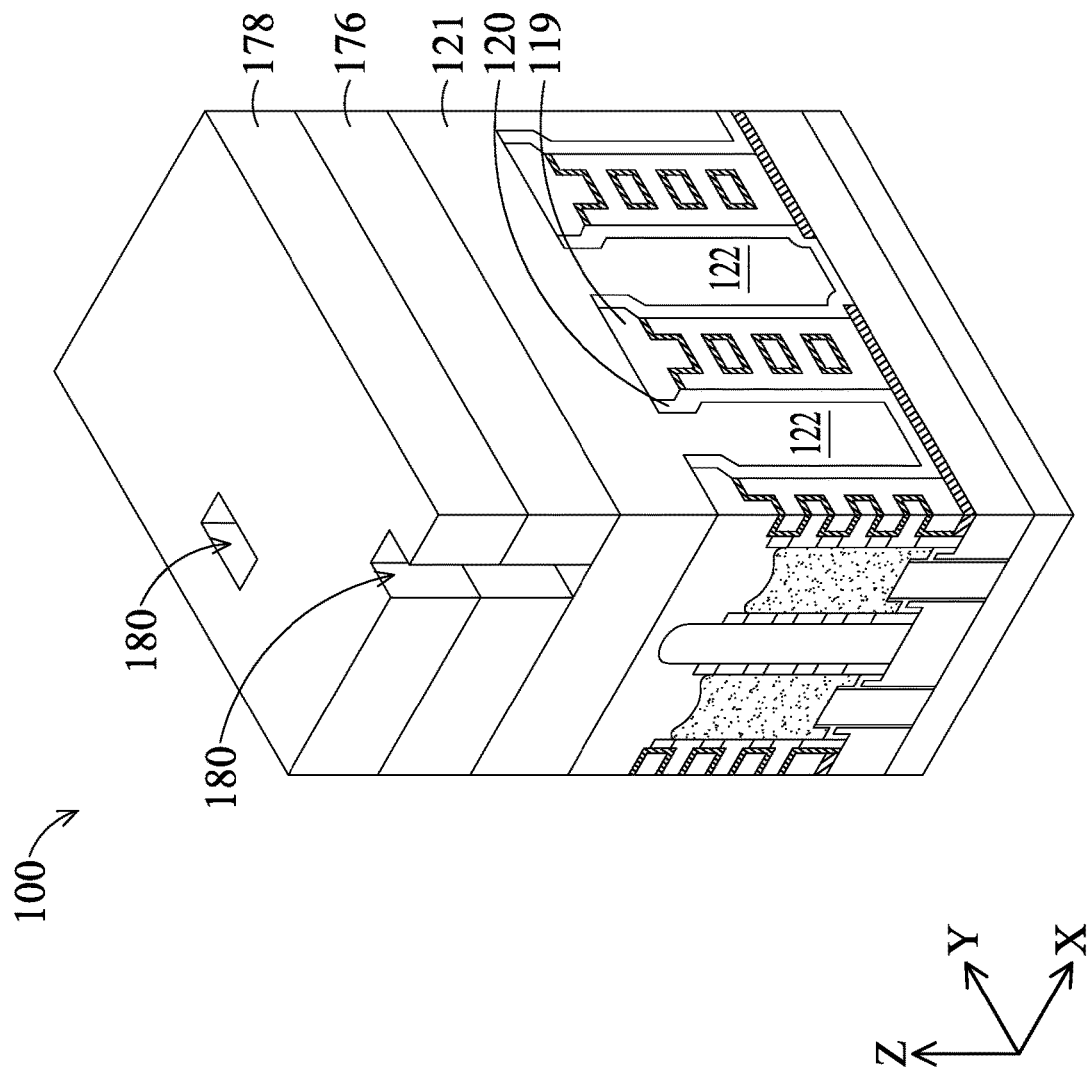
Figure 2Q:
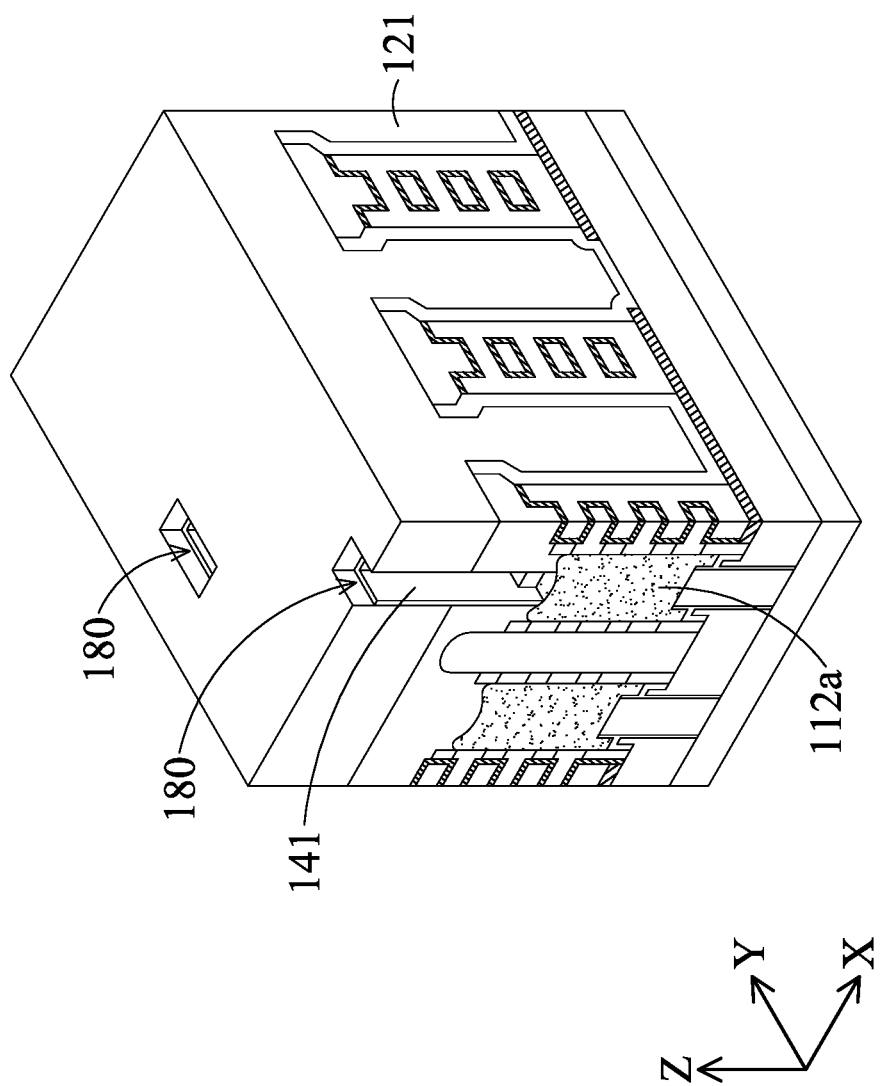
Figure 2R:
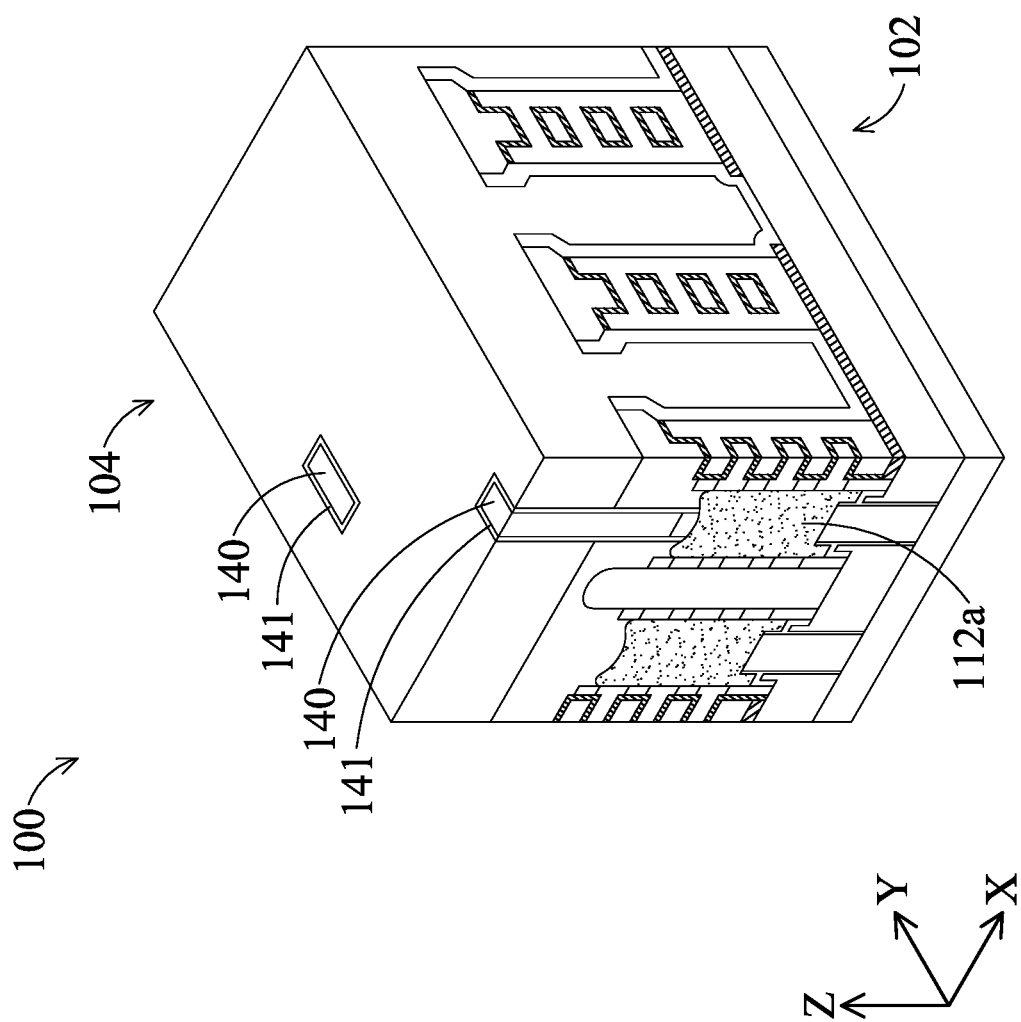

FIGS. 2A-2R are perspective views of an integrated circuit 100 at various stages of processing, in accordance with some embodiments. In particular, FIGS. 2A-2R illustrate a process for forming the integrated circuit 100 shown in FIGS. 1A-1D, in accordance with some embodiments.

In FIG. 2A, the integrated circuit 100 is oriented with the front side 102 facing upward and the backside 104 facing downward. Accordingly, the integrated circuit 100 has not yet been flipped for backside processing. The substrate 101 includes a semiconductor substrate 144 and shallow trench isolation regions 146. The semiconductor substrate 144 may include a single crystalline semiconductor material such as, but not limited to Si, Ge, SiGe, GaAs, InSb, GaP, GaSb, InAlAs, InGaAs, GaSbP, GaAsSb and InP. The shallow trench isolation regions 146 can include a dielectric material such as SiN, SiO, $SiO_2$, SiOC, AlO, AlON, ZrO, HfO, TiO, ZrAlO, ZnO, SiOCN, SiOCN, SiCN, or other suitable dielectric materials.

In FIG. 2A, five transistors 106a-106e are apparent above a substrate 101. The transistors 106a-d are substantially as described in relation to FIG. 1A, except that source/drain contacts 138 have not been formed and the backside gate isolation structures 122 have not yet been formed.

The transistor 106e is not present in FIG. 1A, because the transistor 106e will be removed, as will be described in more detail below. However, the presence of the transistor 106e at this stage of processing helps to illustrate some principles of the transistors 106a-d. In particular, the transistor 106e shows a first source drain region 112d shared with the transistor 106d. The transistor 106e shows a second source/drain region 112a shared with the transistor 106a. The transistor 106e includes semiconductor nanostructures 108e extending in the X direction between the source/drain regions 112d and 112a. The transistor 106e would be operated by applying voltages to the gate electrode 110e (portion of the gate metal 114 surrounding the semiconductor nanostructures 108e) and to the source/drain regions 112a and 112d. This can cause current to flow between the source/drain regions 112a and 112d through each of the semiconductor nanostructures 108e. The structures and operating principles of the transistors 106a-d are substantially the same.

In FIG. 2A, dielectric layers 150, 152, and 154 have been formed above the source/drain regions 112a and 112d and between the upper portions of the gate metal 114. The dielectric layers 150 and 152 act as gate spacer layers for the gate metal 114. The dielectric layers 150, 152, and 154 can each include one or more of SiN, SiO, $SiO_2$, SiOC, AlO, AlON, ZrO, HfO, TiO, ZrAlO, ZnO, SiOCN, SiOCN, SiCN, or other suitable dielectric materials.

The integrated circuit 100 includes dielectric barriers 156 between the source/drain regions 112 and the semiconductor substrate 144. This can help minimize leakage to the semiconductor substrate 144. The dielectric barriers 156 can include one or more of SiN, SiO, $SiO_2$, SiOC, AlO, AlON, ZrO, HfO, TiO, ZrAlO, ZnO, SiOCN, SiOCN, SiCN, or other suitable dielectric materials.

In FIG. 2B, a layer of photoresist 158 has been deposited on the integrated circuit 100. The photoresist 150 has been patterned using photolithography processes to expose a portion of the integrated circuit 100 below the photoresist 158. A trench 159 has been formed in the integrated circuit 100 at the exposed portion of the photoresist 158. The trench substantially removes the semiconductor nanostructures 108e and the portions of the gate metal 114 associated with the transistor 106e. The trench exposes portions of the semiconductor substrate 144, the shallow trench isolation 146, the inner spacers 118, and the dielectric layer 150.

In FIG. 2C, the trench 159 has been filled with the dielectric refill material 126. The dielectric refill material 126 can have materials substantially as described in relation to FIG. 1A and can be deposited by chemical vapor deposition (CVD), atomic layer deposition (ALD), or physical vapor deposition (PVD). Other materials and processes can be utilized for the dielectric refill material 126 without departing from the scope of the present disclosure. After deposition of the dielectric refill material 126, the photoresist 158 is removed and a chemical mechanical planarization (CMP) process is performed, reducing the height of the gate metal 114, and the dielectric layers 150, 152, and 154.

In FIG. 2D, an etching process has been performed to recess the gate metal 114 with respect to the dielectric layers 150, 152, 154, and the dielectric refill material 126. The etching process can include a timed etching process that selectively etches the material of the gate metal 114 with respect to the dielectric layers 150, 152, 154, and 156. The recess can have a depth between 0.5 nm and 10 nm.

In FIG. 2E, the gate cap metal 116 has been deposited in the recesses of the gate metal 114. The gate cap metal 116 can have a material and thickness described in relation to FIGS. 1A-1D. The gate cap metal 116 can be deposited by performing a selective deposition process in which the gate cap metal 116 is selectively deposited on the gate metal 114 but not on the dielectric layers 150, 152, 154, or 126. Alternatively, the gate cap metal 116 can be deposited in a blanket deposition process followed by a CMP process that recesses the height of the gate cap metal so that the gate cap metal 116 does not remain on top surfaces of the dielectric layers 150, 152, 154, and 126.

In FIG. 2F, the interlevel dielectric layer 132 has been deposited on the integrated circuit 100. In particular, the interlevel dielectric layer 132 is deposited on the exposed surfaces of the exposed layers of the gate cap metal 116 and the dielectric layers 150, 152, 154, and 126. The interlevel dielectric layer 132 can be deposited by CVD, ALD, PVD, or other suitable dielectric processes. The interlevel dielectric layer 132 can have materials and thicknesses described in relation to FIGS. 1A-1D.

After deposition of the interlevel dielectric layer 132, a photolithography process is performed to pattern a layer of photoresist on the dielectric layer 132. Trenches are then formed through the exposed portions of the interlevel dielectric layer 132 and through the exposed portions of the dielectric layer 154 to expose the source/drain regions 112a and 112d. The liner layer 139 may then be formed on exposed sidewalls of the trench. The liner layer 139 can be formed by CVD, PVD, or ALD. The source/drain contacts 138 can then be formed in the trenches in contact with the source/drain regions 112d and 112a. The source/drain contacts 138 can be deposited by PVD, ALD, or CVD. The source/drain contacts 138 and the liner layer 139 can have materials and dimensions described in relation to FIGS. 1A-1D.

After formation of the source/drain contacts 138, the dielectric layer 134 is deposited on the interlevel dielectric layer 132. The dielectric layer 134 can be deposited by CVD, PVD, or ALD. The dielectric layer 134 can have materials and thicknesses described in relation to FIGS. 1A-1D.

In FIG. 2G, the integrated circuit 100 has been flipped in preparation for back end processing. The front side 102 faces downward and the backside 104 faces upward. A CMP process has been performed to reduce the thickness of the substrate 101. In particular, the thickness of the semiconductor substrate 144 is reduced until the shallow trench isolation regions 146 are exposed.

In FIG. 2H, an etching process has been performed to remove the semiconductor substrate 144. The etching process selectively etches the semiconductor substrate 144 with respect to the shallow trench isolation regions 146. The result is that trenches 160 are formed in the shallow trench isolation regions 146. The trenches 160 expose the dielectric refill layer 126, the source/drain regions 112a and 112d, the gate dielectric 117, and the top inner spacers 118. The etching process removes the dielectric barriers 156.

In FIG. 2I, the dielectric structures 162 have been deposited in the trenches 160 between the shallow trench isolation regions 146. The dielectric structures 162 are of a material with a high etch selectivity with respect to the material of the shallow trench isolation regions 146. The dielectric structures 162 can include SiN, SiOC, AlO, AlON, ZrO, HfO, TiO, ZrAlO, ZnO, SiOCN, SiOCN, SiCN, or other suitable dielectric materials. The dielectric structures 162 can be deposited by CVD, ALD, or PVD. A CMP process is performed after deposition of the dielectric structures 162.

In FIG. 2J, an etching processes been performed to remove the shallow trench isolation regions 146. Because the dielectric structures 162 have a high etch selectivity with respect to the shallow trench isolation regions 146, the shallow trench isolation regions 146 are removed without substantially etching the dielectric structures 162. Removal of the shallow trench isolation regions 146 exposes the dielectric barriers 156 and portions of the gate dielectric 117. Other materials may also be exposed by removal of the shallow trench isolation regions.

In FIG. 2K, a hard mask layer 119 has been deposited on the dielectric structures 162 and in the trenches 164. The hard mask layer 119 can be deposited by CVD, ALD, or PVD. The hard mask layer can include SiN, SiOC, AlO, AlON, ZrO, HfO, TiO, ZrAlO, ZnO, SiOCN, SiOCN, SiCN, or other suitable dielectric materials. After deposition of the hard mask layer 119, an anisotropic etching process is performed to remove the hard mask layer 119 from the bottom of the trenches 164. The anisotropic etching process etches selectively in the downward direction. Accordingly, those portions of the hard mask layer 119 that are less thick in the vertical direction are removed entirely, such as at the bottom of the trenches 164. As will be described in more detail below, the hard mask layer 119 will protect portions of the gate metal 114 that are directly below the hard mask layer 119.

In FIG. 2L, an etching process has been performed to remove the gate metal 114 at locations not covered by the hard mask 119. The etching process selectively etches the gate metal 114 with respect to the hard mask 119. While the etching process etches primarily in the downward direction, some lateral etching of the gate metal 114 also occurs. This leaves recesses in the gate metal 114 below the hard mask 119. The etching process stops in the vertical direction at the gate cap metal 116. The etching process forms trenches 166 through the gate metal 114.

In FIG. 2M, a layer of photoresist 168 has been formed in the trenches 166 and on the hard mask 119. A second layer of photoresist 170 has been formed on the first layer of photo resist 168. A photolithography process has been performed to form an opening 172 in the photoresist 160 and 170, exposing the gate cap metal 116 at the bottom of the opening 172. Similar openings are formed in the photoresist 168 and 170 at any location at which the gate cap metal 116 is to be removed to electrically isolate one gate electrode 110 from another gate electrode 110.

In FIG. 2N, an etching process has been performed to remove the gate cap metal 116 at the bottom of the opening 172 in the photoresist layers 170 and 168. In particular, the hard mask layer 119, in conjunction with the patterned photoresist layers 170 and 168, has been used as a mask to form a break 123 in the gate cap metal 116. The break 123 may have a width in the Y direction substantially equal to the space between adjacent portions of the hard mask layer 119. The etching process selectively removes the gate cap metal 116 with respect to the gate metal 114. Accordingly, the etching process electrically isolates the gate electrode 110b of the transistor 106b from the gate electrodes 110c of the transistor 106c. The gate cap metal 116 remains between the gate electrodes 110a and 110b. Accordingly, the gate electrodes 110a and 110b remain electrically connected to each other by the gate cap metal 116. Removal of the gate cap metal between the gate electrodes 110b and 110c exposes a portion of the interlevel dielectric layer 132.

In FIG. 2O, the dielectric liner layer 120 has been deposited. The dielectric liner layer 120 lines the exposed portions of the hard mask 119, the exposed portions of the gate metal 114, and the exposed portions of the gate cap metal 116. The dielectric liner layer 120 is positioned directly below the hard mask layer 119 at those locations at which the gate metal 114 is recessed below the hard mask layer 119. The dielectric liner layer 120 can have materials and dimensions described in relation to FIGS. 1A-1D. The dielectric liner layer 120 can be deposited by CVD, ALD, or PVD. The dielectric liner layer 120 can help prevent oxidation of the exposed portions of the gate metal 114.

In FIG. 2O, a bulk dielectric layer 121 has been deposited on the dielectric liner layer 120 over the hard mask 119 and in the gaps between portions of the gate metal 114 between the gate electrodes 110a and 110b and between the gate electrodes 110b and 110c. The dielectric liner 120 and the bulk dielectric layer 121 form backside gate isolation structures 122 between adjacent gate electrodes. The bulk dielectric layer 121 can have materials described in relation to FIGS. 2A-2D. The bulk dielectric layer 121 can be deposited by CVD, ALD, or PVD. After deposition of the bulk dielectric layer 121, a CMP process is performed.

In some embodiments, the dielectric liner layer 120 is not present. In these cases, the bulk dielectric layer 121 is in direct contact with the gate metal 114, the gate cap metal 116, and the interlevel dielectric layer 132.

In FIG. 2P, additional bulk dielectric layer 121 has been deposited on the initial bulk dielectric layer 121, on the dielectric liner layer 120 and on the hard mask layer 119. The bulk dielectric layer 121 can have dimensions described in relation to FIGS. 1A-1D.

In FIG. 2P, photoresist layers 176 and 178 have been formed on the bulk dielectric layer 121. A photolithography process has been performed to open trenches 180 in the photoresist layers 176 and 178, exposing portions of the bulk dielectric layer 121.

In FIG. 2Q, the trenches 180 have been extended through the bulk dielectric layer 121 and the hard mask layer 119 to expose selected source/drain regions 112. The dielectric liner 141 has been deposited in the trenches 180. The dielectric liner 141 can be deposited by CVD, ALD, or PVD. The dielectric liner 141 can have materials and dimensions described in relation to FIGS. 1A-1D.

In FIG. 2R, a backside conductive vias 140 have been formed in the trenches 180. The backside conductive vias 140 can electrically connect to selected source/drain regions 112 or even to selected gate electrodes 110, depending on the application. The backside conductive vias 140 can have materials and dimensions described in relation to FIGS. 1A-1D the backside conductive vias 140 can be formed by PVD, ALD, or CVD. A CMP process has been performed to planarize the backside 104 of the integrated circuit 100. The stage of processing shown in FIG. 2R corresponds to the stage of processing shown in FIGS. 1A-1D.

Figure 2S:
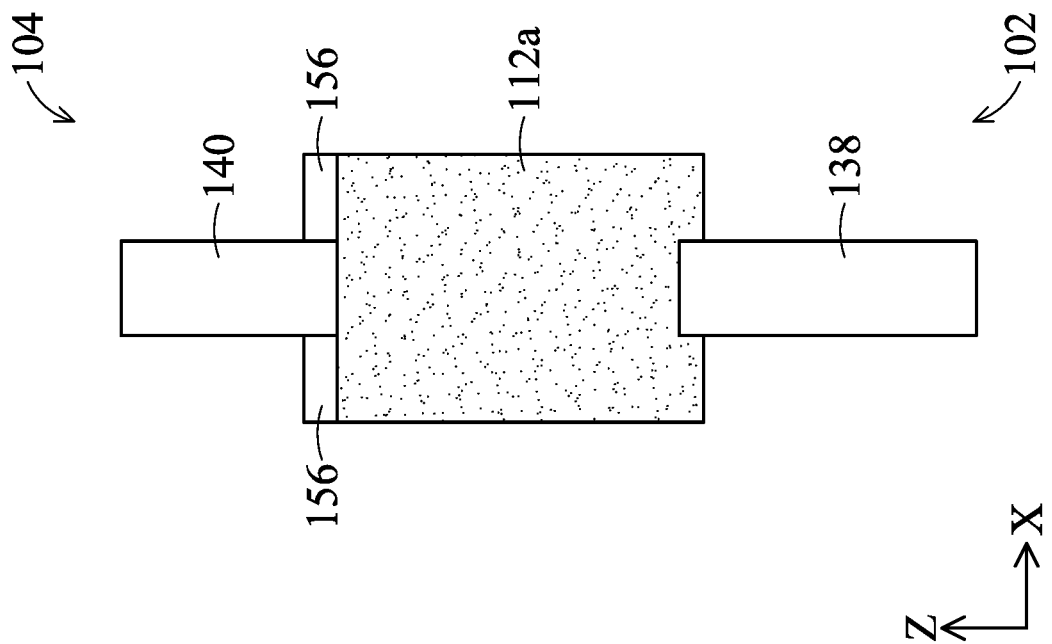

FIG. 2S is a cross-sectional view of the source/drain region 112a, in accordance with some embodiments. The process described in relation to FIGS. 2A-2R, or variations thereof, may leave portions of the dielectric barrier 156 on the source/drain region 112a. The remaining portions of the dielectric barrier 156 may be in contact with the backside conductive via 140 or with the dielectric liner 141.

FIGS. 3A-3D are cross-sectional views of an integrated circuit at intermediate stages of processing, in accordance with some embodiments. The views of FIGS. 3A-3D are one example of a process that can be adapted to provide the structure shown in FIG. 2A. The integrated circuit 100 includes a semiconductor substrate 144 and a semiconductor stack 182 on the semiconductor substrate.

The semiconductor stack 182 includes a plurality of semiconductor layers 184 and sacrificial semiconductor layers 186 alternating with each other. As will be set forth in further detail below, the semiconductor layers 184 will be patterned to form the semiconductor nanostructures 108 of a plurality of transistors 106, though only a single transistor will be illustrated herein. As set forth in more detail below, the sacrificial semiconductor layers 186 will eventually be entirely removed and are utilized to enable forming gate metals and other structures around the semiconductor nanostructures 108.

In some embodiments, the semiconductor layers 184 may be formed of a first semiconductor material suitable for n-type semiconductor nanostructure transistors, such as silicon, silicon carbide, or the like, and the sacrificial semiconductor layers 186 may be formed of a second semiconductor material suitable for p-type semiconductor nanostructure transistors, such as silicon germanium or the like. Each of the layers of the multi-layer stack 182 may be epitaxially grown using a process such as chemical vapor deposition (CVD), atomic layer deposition (ALD), vapor phase epitaxy (VPE), molecular beam epitaxy (MBE), or the like. In a non-limiting example, the semiconductor substrate 144 and the semiconductor layers 184 are silicon, while the sacrificial semiconductor layers 186 are silicon germanium. Other combinations of materials can be utilized without departing from the scope of the present disclosure.

Due to high etch selectivity between the materials of the semiconductor layers 184 and the sacrificial semiconductor layers 186, the sacrificial semiconductor layers 186 of the second semiconductor material may be removed without significantly removing the semiconductor layers 184 of the first semiconductor material, thereby allowing the semiconductor layers 184 to be released to form channel regions of semiconductor nanostructure transistors.

Figure 3A:
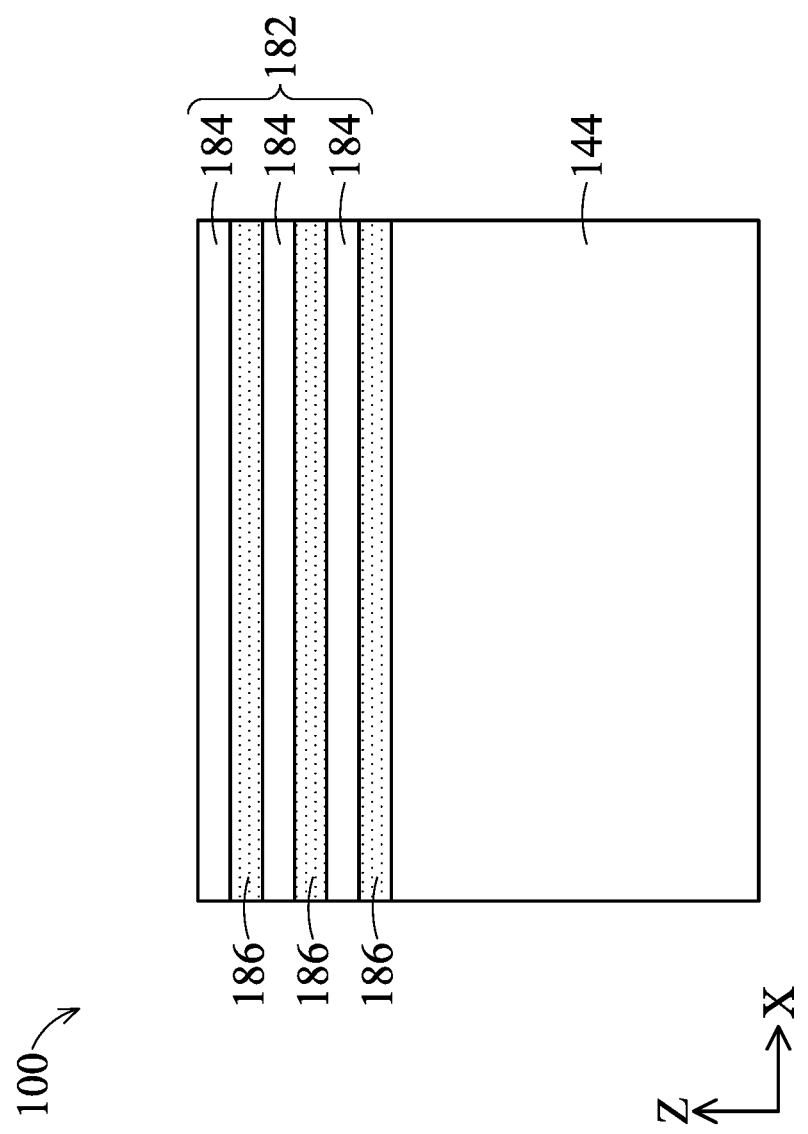
FIGS. 3A-3D are cross-sectional views of an integrated circuit at various stages of processing, in accordance with some embodiments.

The view of FIG. 3A may correspond to a single semiconductor fin that extends in the Y direction. The single fin may be separated from parallel fins by trenches. The trenches may include shallow trench isolation structures and other dielectric structures to separate and electrically isolate adjacent fins. After formation of the fins, shallow trench isolation regions, and the dielectric isolation structures between the fins, the hard mask layer may be removed, substantially resulting in the view of FIG. 3A.

Figure 3B:
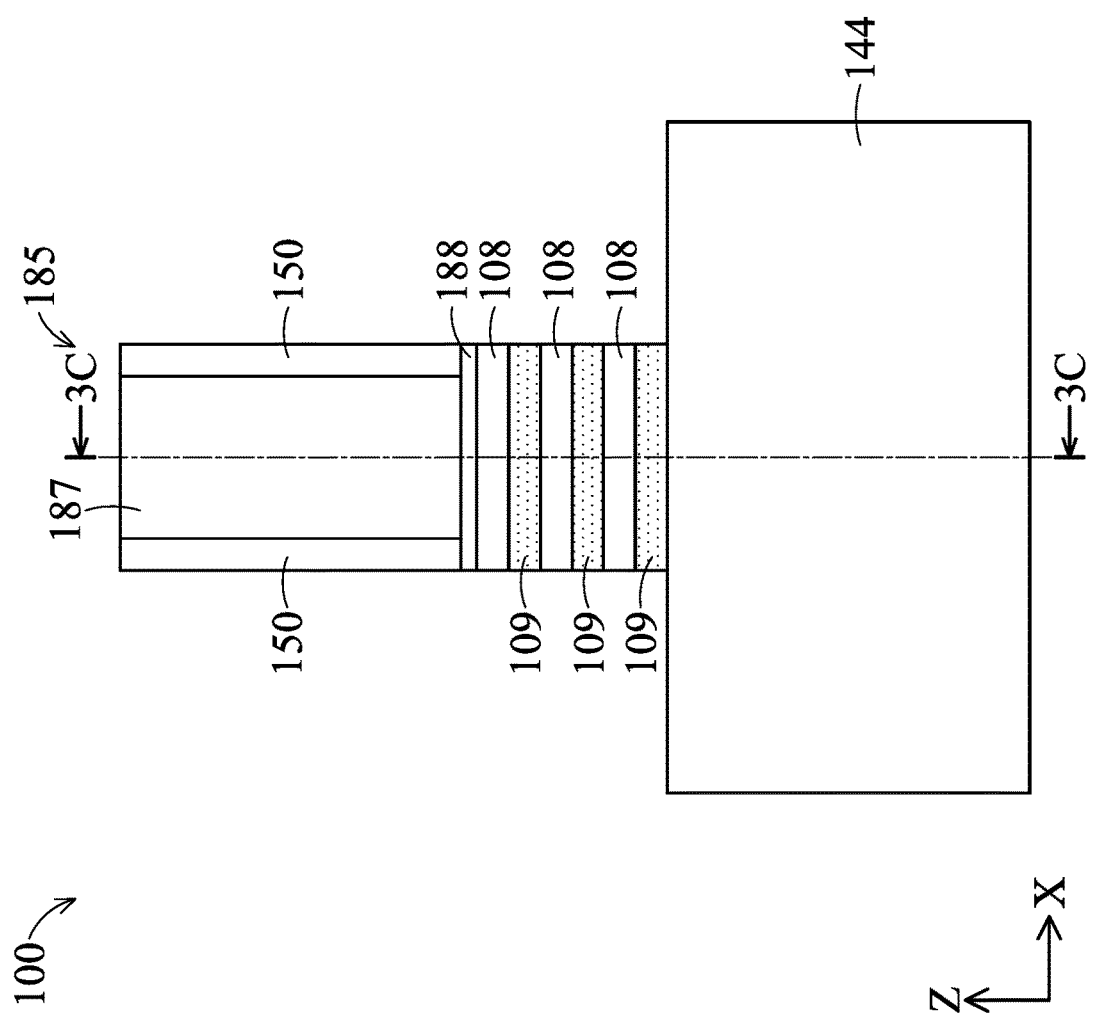

In FIG. 3B, a sacrificial gate structure 185 has been formed over the semiconductor stack 182. The sacrificial gate structure 185 extends in the X direction and crosses the semiconductor stack 182. In practice, the sacrificial gate structure 185 extends across a plurality of adjacent semiconductor fins. One sacrificial gate structure 185 is shown in FIG. 3B. In practice, many further sacrificial gate structures 185 may be formed substantially parallel to and concurrently with the sacrificial gate structure 185 shown in FIG. 3B.

The sacrificial gate structure 185 includes a dielectric layer 188 has been formed prior to forming the sacrificial gate structures 185. The dielectric layer 188 can include a SiO or other suitable dielectric materials. In some embodiments, the dielectric layer 188 has a low K dielectric material. The gate dielectric can be deposited by CVD, ALD, or PVD. Other materials and deposition processes can be utilized for the dielectric layer 188 without departing from the scope of the present disclosure.

The sacrificial gate structure includes a sacrificial gate layer 187 on the dielectric layer 188. The sacrificial gate layer can include materials that have a high etch selectivity with respect to the trench isolation regions (see FIG. 3C). The sacrificial gate layer 187 may be a conductive, semiconductive, or non-conductive material and may be or include amorphous silicon, polycrystalline-silicon (polysilicon), poly-crystalline silicon-germanium (poly-SiGe), metallic nitrides, metallic silicides, metallic oxides, and metals. The sacrificial gate layer 187 may be deposited by physical vapor deposition (PVD), CVD, sputter deposition, or other techniques for depositing the selected material.

After deposition of the layers 187 and 188, these layers may be patterned to act as mask layers. An etching process may then be performed in the presence of the patterned dielectric layers in order to etch exposed regions of the sacrificial gate layer 187 and the sacrificial gate dielectric layer 188. The results of the layers 187 and 188 having the shape shown in FIG. 3B.

In FIG. 3B, one or more gate spacer layers 150 have been formed covering the sacrificial gate structures 185. The gate spacer layer 150 can be formed by PVD, CVD, ALD, or other suitable deposition processes. The gate spacer layers 150 can include one or more of SiO, SiN, SiON, SiCN, SiOCN, or SiOC. Other materials and deposition processes can be utilized for the gate spacer layers 150 without departing from the scope of the present disclosure.

The deposition process for the gate spacer layers 150 can include a conformal deposition process. The conformal deposition process deposits the material of the gate spacer layers 150 on all exposed horizontal and vertical surfaces. The conformal deposition process results in the horizontal thickness of the gate spacer material on vertical surfaces having substantially same dimension as a vertical thickness of the gate spacer material on horizontal surfaces. Following the deposition of the material of the gate spacer layers 150, and an isotropic etching process can be performed that etches selectively in the downward direction. The duration of the anisotropic etching process is selected to entirely remove the material of the gate spacer layers 150 from horizontal surfaces. Adjacent to vertical surfaces, the vertical thickness of the material of the gate spacer layers 150 is substantially greater than on purely horizontal surfaces. The result is that the etching process does not remove the gate spacer layers 150 from the vertical surfaces.

After patterning of the gate spacer layers 150, one or more etching operations have been performed utilizing the gate spacer layer 150 and the sacrificial gate structure 185 as a mask. The portions of the semiconductor layers 184 and the sacrificial semiconductor layers 186 that are not directly below the gate spacer layer 150 and the sacrificial gate structure 185 are removed. The one or more etching processes defined semiconductor nanostructures 108 from the semiconductor layers 184. The one or more etching processes defined sacrificial semiconductor nanostructures 109 from the sacrificial semiconductor layers 186. The semiconductor nanostructures 108 correspond to stacked channel regions of a transistor 106. As will be set forth in more detail below, the sacrificial semiconductor nanostructures 109 will eventually be entirely removed.

Figure 3C:
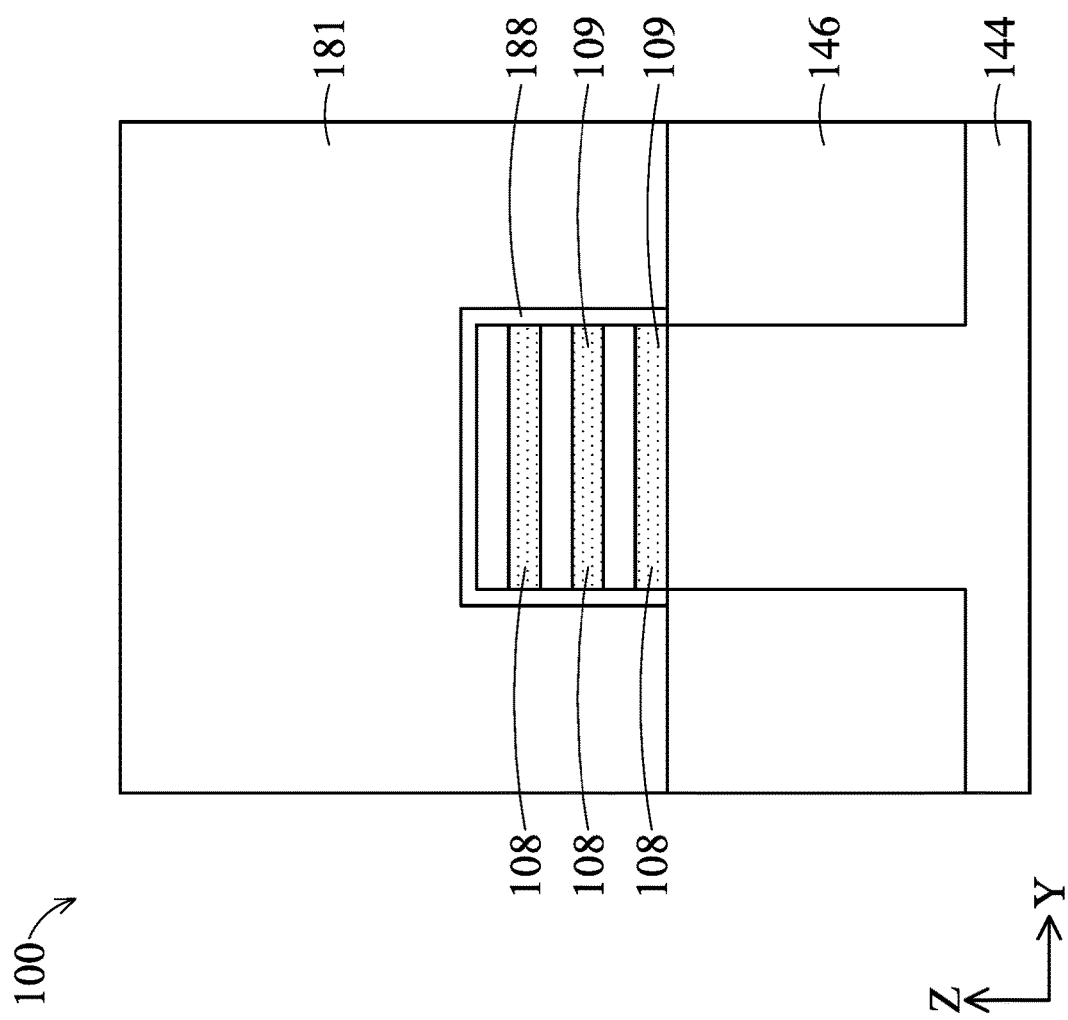

FIG. 3C is a cross-sectional view of the integrated circuit 100 of FIG. 3B taken along cut lines 3C in FIG. 3B, in accordance with some embodiments. FIG. 3C is a Y-view of the integrated circuit 100. The view of FIG. 3C illustrates that the semiconductor stack 182 corresponds to a fin. As described in relation to FIG. 3A, a plurality of fins were previously defined from the semiconductor stack 182, with the structure of FIG. 3A illustrating a portion of one fin that extends in the X direction. FIG. 3C illustrates the shape of the fin in the Y-Z plane.

FIG. 3C illustrates shallow trench isolation regions 146. The shallow trench isolation regions 146 are formed in the trenches between adjacent fins. The trenches extend into the semiconductor substrate 144. After deposition of the shallow trench isolation regions 146 in the trenches, the top surfaces of the shallow trench isolation regions 146 are recessed to be substantially coplanar with a top of the semiconductor substrate 144.

FIG. 3C illustrates that the dielectric layer 188 is formed on the top and side surfaces of the semiconductor fin. FIG. 3C illustrates that the sacrificial gate layer 187 overlies the fins and the shallow trench isolation regions 146 between fins.

Figure 3D:
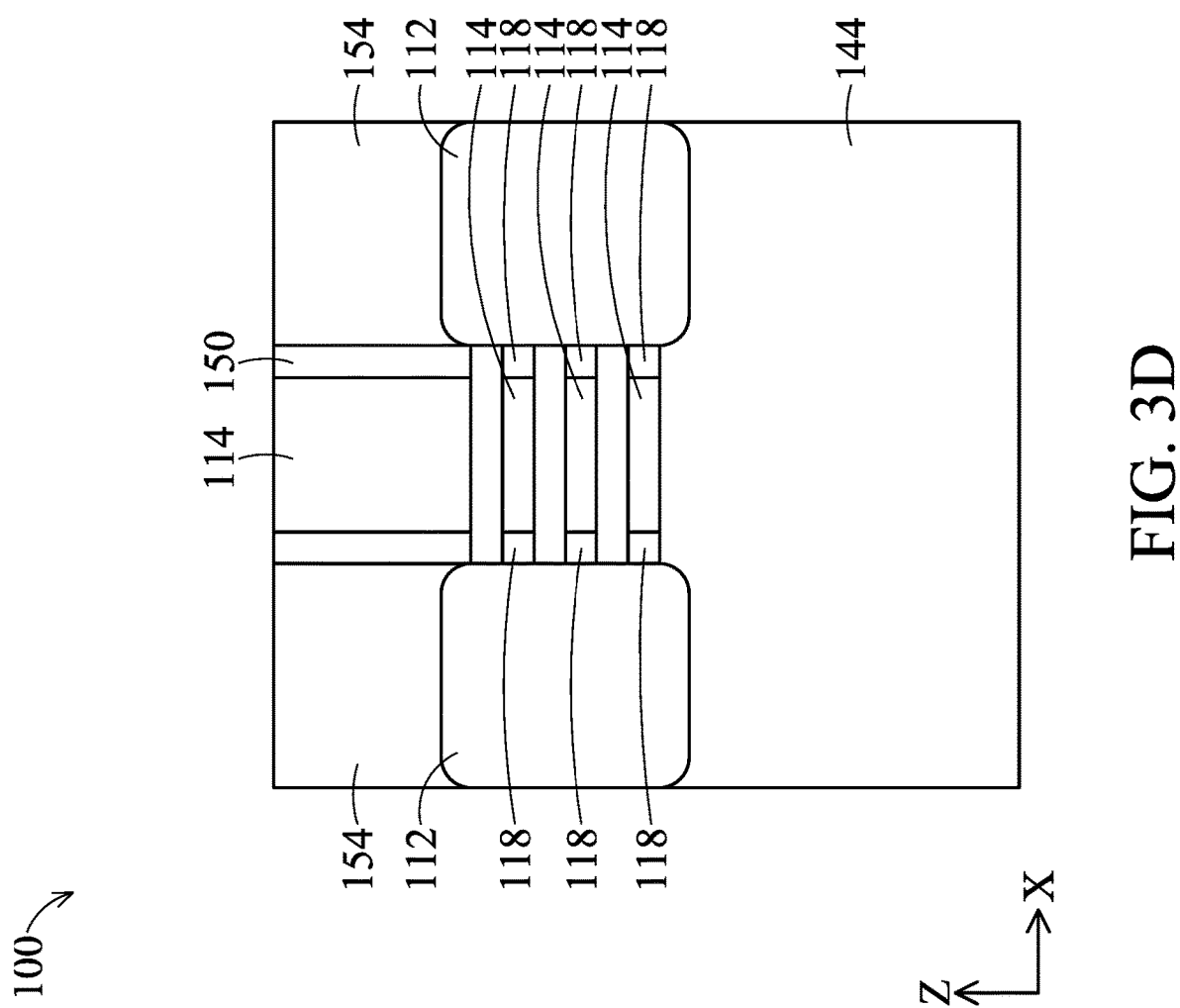

In FIG. 3D, a recessing process has been performed. The recessing process can include an etching process that selectively etches the material of the sacrificial semiconductor nanostructures 109 with respect to the material of the semiconductor nanostructures 108. The etching process is a timed etching process is selected to remove only a small portion of the sacrificial semiconductor nanostructures 109. The etching process can include an anisotropic etching process that etches in the horizontal direction or an anisotropic etching process. Various etching process can be utilized to recess the sacrificial semiconductor nanostructures 109 without departing from the scope of the present disclosure.

In FIG. 3D, inner spacers 118 have been formed in the recesses. The inner spacers are formed by depositing a dielectric material to fill the recesses between the semiconductor nanostructures 108 formed by the previous selective etching process. The inner spacer 118 may be a suitable dielectric material, such as silicon carbon nitride (SiCN), silicon oxycarbonitride (SiOCN), or the like, formed by a suitable deposition method such as physical vapor deposition (PVD), CVD, ALD, or the like. Other materials and deposition processes can be utilized for the inner spacers 118 without departing from the scope of the present disclosure.

After deposition of the inner spacers 118, an etching process, such as an anisotropic etching process, is performed to remove portions of the inner spacers 118 disposed outside the recesses in the sacrificial semiconductor nanostructures 109. In particular, the outer walls or surfaces of the gate spacer layers 150 are utilized as a mask or pattern for defining the outer edges or sidewalls of the inner spacers 118. Accordingly, the outer walls of the inner spacers 118 are substantially aligned with, or coplanar with, the outer walls of the gate spacer layers 150. The result is the inner spacers 118 are shown in FIG. 3D.

In FIG. 3D, source/drain regions 112 have been formed. In the illustrated embodiment, the source/drain regions 112 are epitaxially grown from epitaxial material(s). The source/ drain regions 112 are grown on exposed portions of the fins and contact the semiconductor nanostructures 108. Each semiconductor nanostructure 108 extends in the X direction between two source/drain regions 112. Each semiconductor nanostructure 108 may carry a current between source/drain regions 112 when processing the integrated circuit 100 is complete.

The source/drain regions 112 may be implanted with dopants followed by an annealing process. The source/drain regions 112 may have an impurity concentration of between about $10^{19}$ cm$^{-3}$ and about $10^{21}$ cm$^{-3}$. N-type and/or p-type impurities for source/drain regions 112 may be any of the impurities previously discussed. In some embodiments, the source/drain regions 112 are in situ doped during growth.

In FIG. 3D, an dielectric layer 154 have been formed. The dielectric layer 154 covers the source/drain regions 112. The dielectric layer 154 can include SiO, SiON, SiN, SiC, SiOC, SiOCN, SiON, or other suitable dielectric materials. The dielectric layer 154 can be deposited by CVD, ALD, PVD, or other suitable deposition processes. Though not shown in FIG. 3D, a dielectric liner layer 152 may be deposited prior to deposition of the dielectric layer 154.

In FIG. 3D, the sacrificial gate structures 185 have been removed from between the gate spacer layers 150. Removal of the sacrificial gate structures 185 includes removal of the dielectric layer 188 and the sacrificial gate layer 187 via one or more etching processes. In some embodiments, the sacrificial gate layer 187 is removed by an anisotropic dry etch process. For example, the etching process may include a dry etch process using reaction gases that selectively etch the sacrificial gate layer 187 without etching the inner spacers 118. The dielectric layer 188, when present, may be used as an etch stop layer when the sacrificial gate layer 187 is etched. The dielectric layer 188 may then be removed after the removal of the sacrificial gate layer 187.

In FIG. 3D, semiconductor nanostructures 108 have been released by removal of the sacrificial semiconductor nanostructures 109. The sacrificial semiconductor nanostructures 109 are removed to release the semiconductor nanostructures 108. The sacrificial semiconductor nanostructures 109 can be removed by a selective etching process using an etchant that is selective to the material of the sacrificial semiconductor nanostructures 109, such that the sacrificial semiconductor nanostructures 109 are removed without substantially etching the semiconductor nanostructures 108. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like. In some embodiments, the sacrificial semiconductor nanostructures 109 are removed and the semiconductor nanostructures 108 are patterned to form channel regions of both PFETs and NFETs.

In FIG. 3D, a gate metal 114 has been deposited in place of the semiconductor nanostructures 109 and the sacrificial gate layer 187. In particular, the gate metal 114 is deposited in the void above the semiconductor nanostructures 108 between the gate spacer layers 150 and in the void around the semiconductor nanostructures 108. Though not apparent in FIG. 3D, the gate metal 114 is also deposited in the voids lateral to the semiconductor nanostructures 108 and the Y direction.

Although the gate metal 114 is shown as a single layer in FIG. 3D, in practice, the gate metal 114 can include one or more conductive liner layers, work function layers, and gate fill layers that collectively make up the gate metal. The gate metal can include one or more of Ti, TiN, Ta, TaN, Al, Cu, Co, Ru, W, Au, or other suitable conductive materials. The gate metal 114 can be deposited by PVD, ALD, or CVD. Other configurations, materials, and deposition processes can be utilized for the gate metal 114 without departing from the scope of the present disclosure. Though not shown in FIG. 3D, one or more gate dielectric layers are present between the semiconductor nanostructures 108 and the gate metal 114.

The process described in relation to FIGS. 3A-3D can be utilized to provide an integrated circuit 100 as shown in FIG. 2A, in accordance with some embodiments. Various adaptations may be utilized without departing from the scope of the present disclosure.

Figure 4:
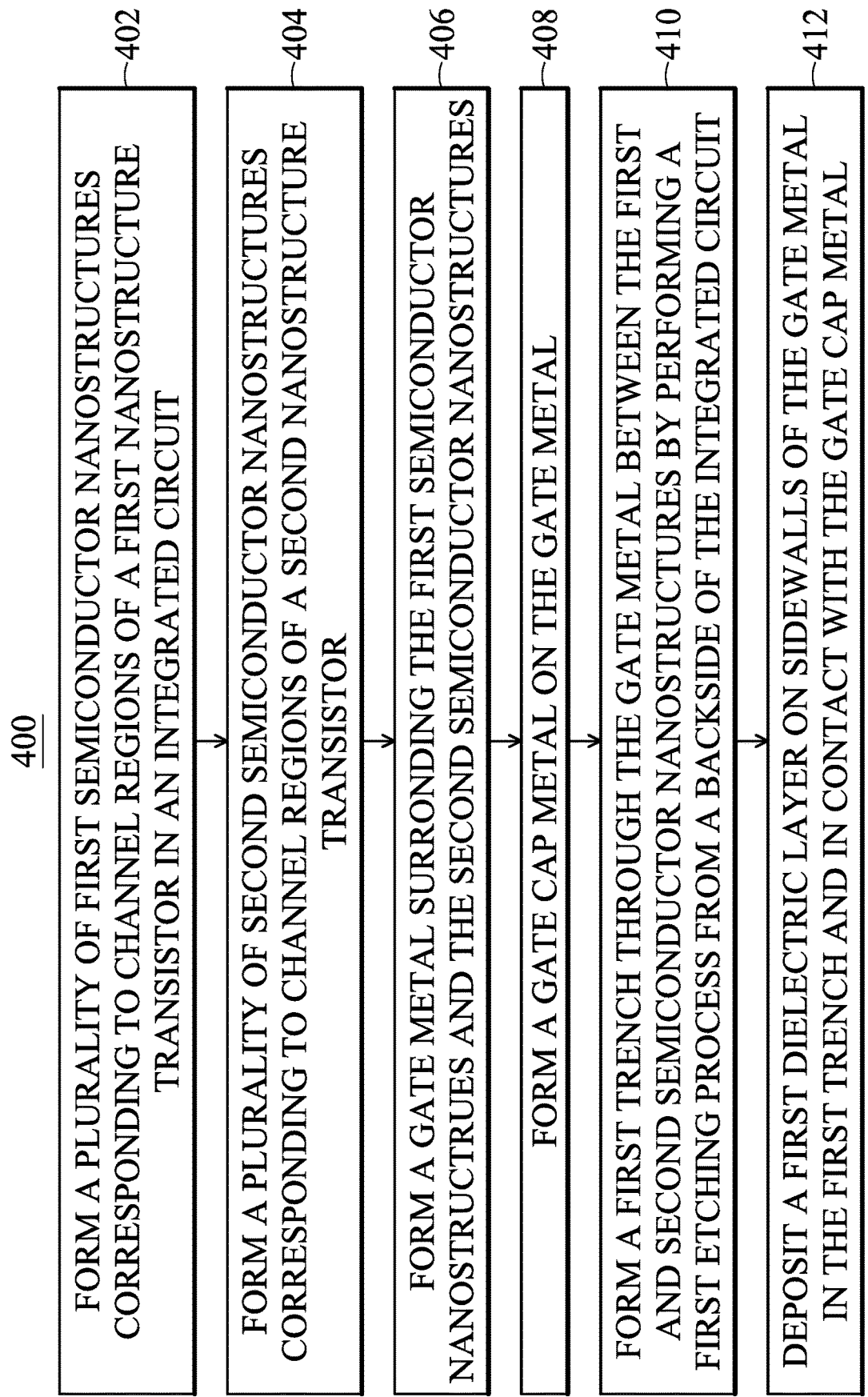
FIG. 4 is a flow diagram of a process for forming an integrated circuit, in accordance with some embodiments.

FIG. 4 is a flow diagram of a method 400 for forming an integrated circuit, in accordance with some embodiments. The method 400 can utilize processes, structures, or components described in relation to FIGS. 1A-3D. At 402, the method 400 includes forming a plurality of first semiconductor nanostructures corresponding to channel regions of a first nanostructure transistor in an integrated circuit. One example of first semiconductor nanostructures are the semiconductor nanostructures 108a of FIG. 1A. One example of a first nanostructure transistor is the transistor 106a of FIG. 1A. One example of an integrated circuit is the integrated circuit 100 of FIG. 1A. One example of forming the plurality of first semiconductor nanostructures is found in relation to FIG. 3B in which semiconductor nanostructures 108 have been formed from the semiconductor layers 184 of FIG. 3A. At 404, the method 400 includes forming a plurality of second semiconductor nanostructures corresponding to channel regions of a second nanostructure transistor. One example of second semiconductor nanostructures are the semiconductor nanostructures 108b of FIG. 1A. One example of a second nanostructure transistor is the transistor 106b of FIG. 1A. The plurality of second semiconductor nanostructures can be formed using the process described in relation to FIGS. 3A and 3B. At 406, the method 400 includes forming a gate metal surrounding the first semiconductor nanostructures and the second semiconductor nanostructures. One example of a gate metal is the gate metal 114 of FIG. 1A. At 408, the method 400 includes forming a gate cap metal on the gate metal. One example of a gate cap metal is the gate cap metal 116 of One example of forming a gate cap metal can be found in relation to FIG. 3D in which the gate metal 114 has been deposited after removal of the sacrificial gate layer 187 and the sacrificial semiconductor nanostructures 109 of FIG. 3B. At 410, the method 400 includes forming a first trench through the gate metal between the first and second semiconductor nanostructures by performing a first etching process from a backside of the integrated circuit. One example of a first trench is the trench 166 of FIG. 2L. At 412, the method 400 includes depositing a first dielectric layer on sidewalls of the gate metal in the first trench and in contact with the gate cap metal. One example of a first dielectric layer is the dielectric layer 120 of FIG. 1A.

Embodiments of the present disclosure provide an integrated circuit with nanostructure transistors having improved performance. In particular, embodiments of the present disclosure utilize a backside gate cutting process to reduce the parasitic capacitance between gate electrodes and source/drain contacts of adjacent transistors and to electrically isolate the gate electrodes of some adjacent transistors in a selective manner.

The transistors each have a plurality of semiconductor nanostructures formed over a substrate. The nanostructures act as channel regions of the nanostructure transistor. The gate electrode of each transistor includes a gate metal surrounding the nanostructures and a thin gate cap metal on top of the gate metal. When the gate metal of the gate electrodes is initially deposited, the gate metal of the gate electrodes may initially be conjoined together. The specific circuit arrangements of the transistor may call for some adjacent gate electrodes to be shorted together, and for other adjacent gate electrodes to be isolated from each other. Embodiments of the present disclosure advantageously reduce parasitic capacitances associated with the gate electrodes by removing large amounts of the gate metal between adjacent gate electrodes. Complete electrical isolation of adjacent gate electrodes can then be accomplished by selectively removing portions of the gate cap metal between adjacent transistors. The result is transistors having improved switching speed and reduced power consumption.

In some embodiments, an integrated circuit includes a first nanostructure transistor including a plurality of first semiconductor nanostructures and a first gate electrode surrounding the first semiconductor nanostructures. The integrated circuit includes a second nanostructure transistor including a plurality of second semiconductor nanostructures and a second gate electrode surrounding the second semiconductor nanostructures. The integrated circuit includes a first backside gate isolation structure extending between the first gate electrode and the second gate electrode from a backside of the integrated circuit. The integrated circuit includes a gate cap metal in contact with the first gate electrode, the second electrode, and the gate first backside gate isolation structure and electrically connecting the first gate electrode to the second gate electrode.

In some embodiments, a method includes forming a plurality of first semiconductor nanostructures corresponding to channel regions of a first nanostructure transistor in an integrated circuit and forming a plurality of second semiconductor nanostructures corresponding to channel regions of a second nanostructure transistor. The method includes forming a gate metal surrounding the first semiconductor nanostructures and the second semiconductor nanostructures and forming a gate cap metal on the gate metal. The method includes forming a first trench through the gate metal between the first and second semiconductor nanostructures by performing a first etching process from a backside of the integrated circuit an depositing a first dielectric layer on sidewalls of the gate metal in the first trench and in contact with the gate cap metal.

In some embodiments, an integrated circuit includes a first nanostructure transistor including a first gate electrode, a second nanostructure transistor including a second gate electrode, and a first backside trench separating the first gate electrode from the second gate electrode. The integrated circuit includes a dielectric liner layer lining sidewalls of the first gate electrode and the second gate electrode in the first backside trench, a bulk dielectric layer on the dielectric liner layer and filling the first backside trench, and a gate cap metal in contact with the first gate electrode, the second gate electrode and the dielectric liner layer at the first backside trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a first nanostructure transistor including a plurality of first semiconductor nanostructures and a first gate electrode surrounding the first semiconductor nanostructures;
   a second nanostructure transistor including a plurality of second semiconductor nanostructures and a second gate electrode surrounding the second semiconductor nanostructures;
   a first backside gate isolation structure extending between the first gate electrode and the second gate electrode from a backside of the integrated circuit; and
   a gate cap metal in contact with the first gate electrode, the second gate electrode, and the first backside gate isolation structure and electrically connecting the first gate electrode to the second gate electrode, wherein the first backside gate isolation structure has a substantially uniform first width between the first and second gate electrodes, wherein the first backside gate isolation structure has a second width that is smaller than the first width at a vertical level higher than the first and second gate electrodes.

2. The integrated circuit of claim 1, wherein the first backside gate isolation structure includes:
   a first dielectric layer lining sidewalls of the first gate electrode, lining sidewalls of the second gate electrode, and in contact with the gate cap metal; and
   a second dielectric layer on the first dielectric layer and filling a first trench between the first and second gate electrodes.

3. The integrated circuit of claim 2, comprising:
   a third nanostructure transistor including a plurality of third semiconductor nanostructures and a third gate electrode surrounding the third semiconductor nanostructures, wherein the gate cap metal is in contact with the third gate electrode;
   an interlevel dielectric layer over the first, second, and third semiconductor nanostructures;
   a second trench between the second gate electrode and the third gate electrode and between the second semiconductor nanostructures and the third semiconductor nanostructures; and
   a second backside gate isolation structure in the second trench including the first dielectric layer on sidewalls of the third gate electrode in the second trench and in contact with the interlevel dielectric layer at the second trench via a break in the gate cap metal at the second trench, wherein the first interlevel dielectric layer is separated from the interlevel dielectric layer by the gate cap metal at the first trench.

4. The integrated circuit of claim 3, wherein the second gate electrode is electrically isolated form the third gate electrode.

5. The integrated circuit of claim 1, wherein the first backside gate isolation structure includes a bulk dielectric layer in contact with sidewalls of the first and second gate electrodes and the gate cap metal.

6. The integrated circuit of claim 5, comprising:
   a source/drain region of the first nanostructure transistor;
   a backside conductive via extending through the bulk dielectric layer to the source/drain region;
   an interlevel dielectric layer over the first nanostructure transistor; and a source/drain contact extending through the interlevel dielectric layer to the source/drain region.

7. An integrated circuit including:
a first nanostructure transistor including a first gate electrode;
a second nanostructure transistor including a second gate electrode;
a first backside trench separating the first gate electrode from the second gate electrode;
a dielectric liner layer lining sidewalls of the first gate electrode and the second gate electrode in the first backside trench;
a bulk dielectric layer on the dielectric liner layer and filling the first backside trench; and
a gate cap metal in contact with the first gate electrode, the second gate electrode and the dielectric liner layer at the first backside trench.

8. The integrated circuit of claim 7, comprising a backside hard mask having an opening, wherein the bulk dielectric layer is on a bottom surface of the backside hard mask and fills the first backside trench through the opening.

9. The integrated circuit of claim 7, comprising:
a third nanostructure transistor including a third gate electrode; and
a second backside trench separating the second gate electrode from the third gate electrode, wherein the dielectric liner layer lines sidewalls of the second gate electrode and the third gate electrode in the second backside trench, wherein the bulk dielectric layer fills the second backside trench.

10. The integrated circuit of claim 7, wherein the first nanostructure transistor includes a source/drain region.

11. A device, comprising:
a first transistor including:
a plurality of stacked first channels:
a first gate electrode wrapped around the first channels;
a second transistor including:
a plurality of stacked second channels:
a second gate electrode wrapped around the second channels;
a first gate cap metal structure on a top surface of the first gate electrode;
a second gate cap metal structure on a top surface of the second gate electrode;
an interlevel dielectric layer above the first gate cap metal structure and the second gate cap metal structure;
a substrate below the first and second transistors;
a first trench extending through the substrate and between the first and second gate metals;
a first dielectric layer on sidewalls of the first gate metal and the second gate metal in the first trench and in contact with a side surface of the first gate cap metal structure and a side surface of the second gate cap meal structure.

12. The device of claim 11, further comprising a first bulk dielectric layer filling the trench in the substrate and between the first and second gate electrodes.

13. The device of claim 12, further comprising:
a third transistor including:
a plurality of stacked third channels:
a third gate electrode wrapped around the third channels, wherein the second gate cap metal structure is on a top surface of the third gate electrode.

14. The device of claim 13, further comprising:
a second trench extending through the substrate and between the second and third gate metals;
a second dielectric layer on sidewalls of the first gate metal and the second gate metal in the second trench and in contact with a bottom surface of the second gate cap metal structure.

15. The device of claim 14, wherein the first gate electrode and the second gate electrode are electrically isolated from each other.

16. The device of claim 15, wherein after the second gate cap metal structure electrically connects the second gate electrode and the third gate electrode.

17. The device of claim 12, wherein the first dielectric liner layer is in contact with the interlevel dielectric layer at the first trench.

18. The device of claim 12, wherein the first bulk dielectric material is separated from the interlevel dielectric layer by the first dielectric liner layer.

19. The device of claim 18, further comprising:
a source/drain region of the first transistor in contact with the first channels; and
a backside conductive via in contact with the source/drain region.

20. The device of claim 12, further comprising a backside hard mask on the substrate having an opening, wherein the first bulk dielectric layer is on a bottom surface of the backside hard mask and fills the first trench through the opening.

* * * * *